(12) United States Patent
Hwang et al.

(10) Patent No.: US 11,335,410 B2
(45) Date of Patent: May 17, 2022

(54) MEMORY DEVICE AND METHOD OF OPERATING THE SAME

(71) Applicant: SK hynix Inc., Icheon-si (KR)

(72) Inventors: Sung Hyun Hwang, Icheon-si (KR); Yeong Jo Mun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/038,221

(22) Filed: Sep. 30, 2020

(65) Prior Publication Data
US 2021/0327513 A1 Oct. 21, 2021

(30) Foreign Application Priority Data

Apr. 16, 2020 (KR) ........................ 10-2020-0046171

(51) Int. Cl.
*G11C 16/14* (2006.01)
*G11C 16/08* (2006.01)
*G11C 16/04* (2006.01)

(52) U.S. Cl.
CPC .......... *G11C 16/14* (2013.01); *G11C 16/0483* (2013.01); *G11C 16/08* (2013.01)

(58) Field of Classification Search
CPC ...... G11C 16/14; G11C 16/0483; G11C 16/08
See application file for complete search history.

(56) References Cited

U.S. PATENT DOCUMENTS

| 6,009,016 | A | * | 12/1999 | Ishii | ........................ | G11C 16/10 |
| | | | | | | 365/185.18 |
| 9,824,765 | B2 | * | 11/2017 | Park | ........................ | G11C 16/10 |
| 2013/0083599 | A1 | * | 4/2013 | Nam | .................. | G11C 16/0466 |
| | | | | | | 365/185.11 |
| 2020/0365211 | A1 | * | 11/2020 | Nam | .................... | G11C 11/5635 |

FOREIGN PATENT DOCUMENTS

| KR | 1020140133268 A | 11/2014 |
| KR | 101811035 B1 | 12/2017 |

* cited by examiner

*Primary Examiner* — Jay W. Radke
(74) *Attorney, Agent, or Firm* — William Park & Associates Ltd.

(57) ABSTRACT

A memory device that controls a floating time point of word lines connected to a sub block adjacent to a sub block on which an erase operation is performed includes a plurality of memory blocks each including a plurality of sub blocks, a voltage generator configured to generate a plurality of voltages to perform an erase operation on any of the plurality of sub blocks, and control logic configured to divide a plurality of word lines connected to an adjacent sub block neighboring a sub block on which the erase operation is performed into a plurality of groups, and configured to control the voltage generator to differently set a floating time point of word lines included in each group for each of the plurality of groups, during the erase operation.

20 Claims, 17 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0046171, filed on Apr. 16, 2020, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under the control of a host device such as a computer, a smart phone, or a smart pad. The storage device includes a device that stores data in a magnetic disk such as a hard disk drive (HDD), a device that stores data in a semiconductor memory such as a solid state drive (SSD), or a memory card, in particular, a non-volatile memory.

The storage device may include a memory device in which data is stored and a memory controller that stores data in the memory device. The memory device may be classified as a volatile memory device or a non-volatile memory device. Here, the non-volatile memory includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM) and the like.

SUMMARY

An embodiment of the present disclosure provides a memory device and a method of operating the same, which controls a floating time point of word lines connected to a sub block adjacent to a sub block in which an erase operation is performed during the erase operation on the sub block.

A memory device according to an embodiment of the present disclosure may include a plurality of memory blocks each including a plurality of sub blocks, a voltage generator configured to generate a plurality of voltages to perform an erase operation on any of the plurality of sub blocks, and control logic configured to divide a plurality of word lines connected to an adjacent sub block neighboring a sub block on which the erase operation is performed into a plurality of groups, and configured to control the voltage generator to differently set a floating time point of word lines included in each group for each of the plurality of groups, during the erase operation.

According to an embodiment of the present disclosure, a method of operating a memory device including a plurality of memory blocks each including a plurality of sub blocks includes dividing a plurality of word lines connected to an adjacent sub block neighboring a sub block on which an erase operation is performed into a plurality of groups, during the erase operation on any one of the plurality of sub blocks. The method also includes differently setting a floating time point of word lines included in each group for each of the plurality of groups.

According to the present technology, for some embodiments, a disturb phenomenon of the adjacent sub block may be prevented by controlling the floating time point of the word lines connected to the sub block adjacent to the sub block on which the erase operation is performed.

DETAILED DESCRIPTION

Specific structural or functional descriptions of embodiments according to the concepts which are disclosed in the present specification or application are illustrated only to describe the embodiments according to the concepts of the present disclosure. The embodiments according to the concepts of the present disclosure may be carried out in various forms and the descriptions are not limited to the embodiments described in the present specification or application.

Figure 1:
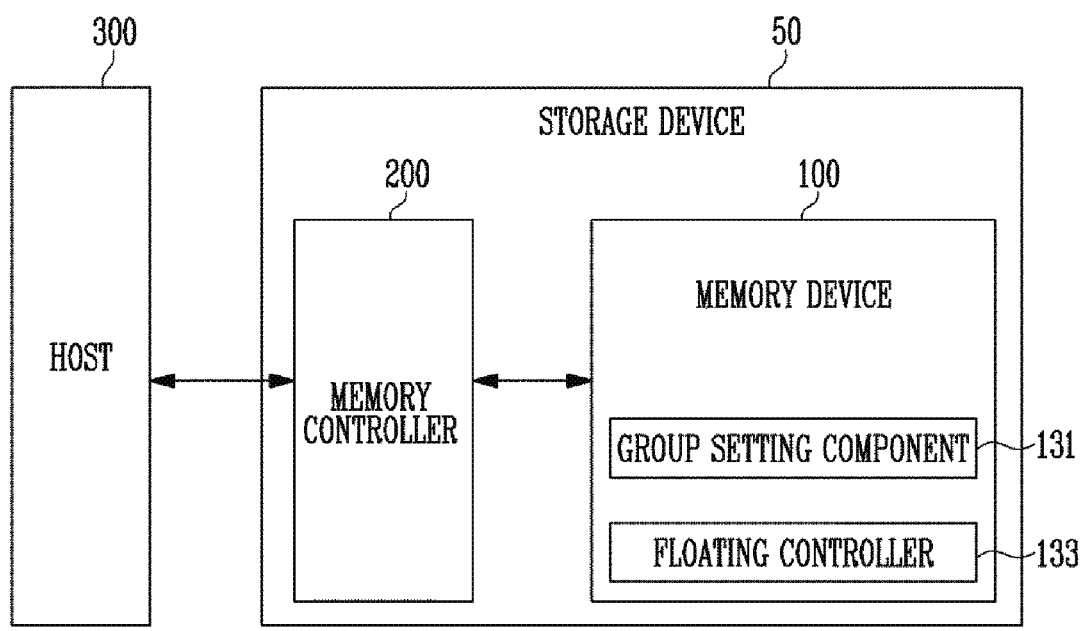
FIG. 1 is a block diagram for describing a storage device.

FIG. 1 is a block diagram for describing a storage device.

Referring to FIG. 1, the storage device 50 may include a memory device 100 and a memory controller 200.

The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages, such as a package on package (POP), a system in package (SIP), a system on chip (SOC), a multi-chip package (MCP), a chip on board (COB), a wafer-level fabricated package (WFP), or a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. The memory block may be a unit for erasing data.

In an embodiment, each of the memory blocks included in the memory device 100 may be divided into a plurality of sub blocks. Furthermore, the memory device 100 may perform the erase operation in a sub block unit not in a memory block unit.

According to the related art, the memory device 100 performs the erase operation in the memory block unit, but as the memory device 100 is implemented in a three-dimensional array structure and the number of stacked layers increases, the erase operation is required to be performed in the sub block unit. That is, because a size of the memory block increases as the memory device 100 is implemented as the three-dimensional array structure, the erase operation is required to be performed in the sub block unit. By such necessity, the memory device 100 may perform the erase operation in the sub block unit as well as the memory block unit.

However, when the erase operation is performed in the sub block unit, memory cells included in a sub block adjacent to a corresponding sub block may be erased as well as memory cells included in a sub block on which the erase operation is performed, or a disturb phenomenon may occur in the memory cells included in the adjacent sub block. That is, as an erase voltage is applied, a threshold voltage distribution of the memory cells of the sub block adjacent to the sub block on which the erase operation is performed may be changed in an unexpected direction. Therefore, the adjacent sub block is required to be controlled in a method different from the related art.

Therefore, during the erase operation, the memory device 100 may gradually decrease a voltage distribution applied to word lines connected to the adjacent sub block from a center portion of the adjacent sub block toward both ends. That is, a floating time point of the word lines is required to be controlled slowly toward an edge portion of the adjacent sub block.

In an embodiment, the memory device 100 may include a group setting component 131. The group setting component 131 may divide the word lines connected to the sub block into at least two or more groups.

That is, the group setting component 131 may divide the word lines into a plurality of groups in order to set differently the floating time point of the word lines connected to the sub block adjacent to the sub block on which the erase operation is performed. Furthermore, the group setting component 131 may divide the word lines into a larger number of groups according to a degree of disturbance or in order to more precisely adjust the floating time point of the word lines. When the word lines connected to the sub block adjacent to the sub block on which the erase operation is performed are divided into the plurality of groups, the memory device 100 may control the floating time point of each of the word lines included in the divided groups.

In an embodiment, the memory device 100 may include a floating controller 133.

In an embodiment, during the erase operation on the sub block, the floating controller 133 may differently control the floating time point of the word lines connected to the sub block adjacent to the sub block on which the erase operation is performed. For example, the floating controller 133 may control the floating time point so that a voltage applied to the word lines decreases toward the edge portion in the sub block adjacent to the sub block on which the erase operation is performed.

In an embodiment, the floating controller 133 may first float at least one word line of the center portion in the sub block. Thereafter, the floating controller 133 may sequentially float the word lines from the center portion to the edge portion. The voltage applied to the word lines connected to the sub block may be sequentially decreased from the center portion to the edge portion through such a floating process.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single-level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple-level cell (TLC) method of storing three data bits in one memory cell, or a quadruple-level cell (QLC) method of storing four data bits in one memory cell.

The memory device 100 is configured to receive a command and an address from the memory controller 200 and access a region selected by the address in the memory cell array. That is, the memory device 100 may perform an operation corresponding to the command on the region selected by the address. For example, the memory device 100 may perform a write operation (program operation), a read operation, or an erase operation according to the received command. For example, when a program command is received, the memory device 100 may program data to the region selected by the address. When a read command is received, the memory device 100 may read data from the region selected by the address. When an erase command is received, the memory device 100 may erase data stored in the region selected by the address.

The memory controller 200 may control overall operations of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data included in the memory device 100 is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to the request of the host 300. For example, when a program request is received from the host 300, the memory controller 200 may converts the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide a command, an address, and data to the memory device 100 so as to perform background operations such as a program operation for wear leveling and a program operation for garbage collection.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store codes or commands executed by the memory controller 200.

Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or Rambus dynamic random access memory (DRAM), or a static random access memory (SRAM).

In various embodiments, the buffer memory may be connected from an outside of the storage device 50. In this case, the volatile memory devices connected to the outside of the storage device 50 may serve as the buffer memory.

In an embodiment, the memory controller 200 may control at least two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
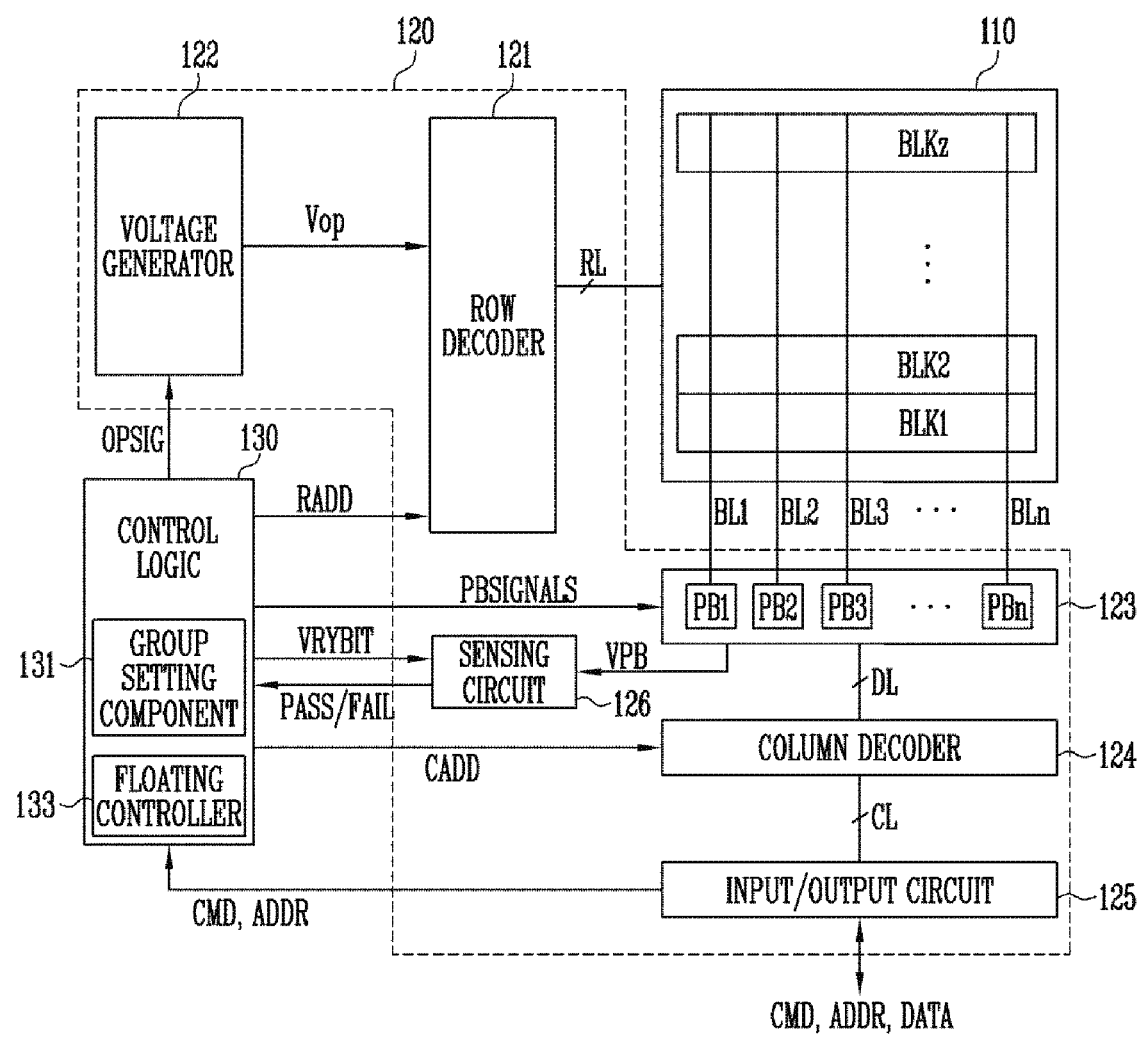
FIG. 2 is diagram for describing a structure of a memory device of FIG. 1.

FIG. 2 is diagram for describing a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single-level cell (SLC) that stores one data bit, a multi-level cell (MLC) that stores two data bits, a triple-level cell (TLC) that stores three data bits, or a quadruple-level cell (QLC) that stores four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cell through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under the control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation has passed or failed in response to the pass or fail signal PASS or FAIL.

The control logic 130 may include the group setting component 131. The group setting component 131 may divide the word lines connected to the memory block into the plurality of groups. The control logic 130 may be implemented as hardware, software, or a combination of hardware and software. For example, the control logic 130 may be a control logic circuit operating in accordance with an algorithm and/or a processor executing control logic code.

In an embodiment, the command CMD received from the outside may be a command instructing to perform the erase operation on the sub block. That is, the erase operation on the sub block in any one of the plurality of memory blocks included in the memory cell array 110 may be performed.

At this time, when the control logic 130 receives the command instructing to perform the erase operation on the sub block, the group setting component 131 may divide the word lines connected to the sub block adjacent to the sub block on which the erase operation is performed into the plurality of groups. The word lines connected to the adjacent sub block may be divided into three or more groups, and the number of word lines included in one group may be at least one. Here, the group setting component 131 may divide the word lines connected to the adjacent sub block into one group including a center word line and groups adjacent thereto based on the center word line.

In an embodiment, when the memory cells included in the sub block adjacent to the sub block on which the erase operation is performed are very affected by the disturbance, or when a time point at which the word lines are floated is required to be more precisely set, the group setting component 131 may divide the word lines connected to the adjacent sub block into a larger number of groups. At this time, each of the divided groups may include at least one word line.

In an embodiment, the control logic 130 may include a floating controller 133. When the word lines connected to the sub block adjacent to the sub block on which the erase operation is performed are divided into the plurality of groups by the group setting component 131, the floating controller 133 may control the floating time point of the word lines included in the plurality of groups.

For example, when the word lines connected to the adjacent sub block are divided into the plurality of groups, the floating controller 133 may first float the word lines of the group including the center word line. Thereafter, the word lines of two groups adjacent to the center portion may be floated.

The floating controller 133 may control floating of the word lines so that the word lines of two adjacent groups are simultaneously floated starting from the center portion as described above.

The memory cells included in the memory cell array 110 may be programmed to any one of a plurality of program states according to data stored in each memory cell. A target program state of the memory cell may be determined as any one of the plurality of program states according to data to be stored.

Figure 3:
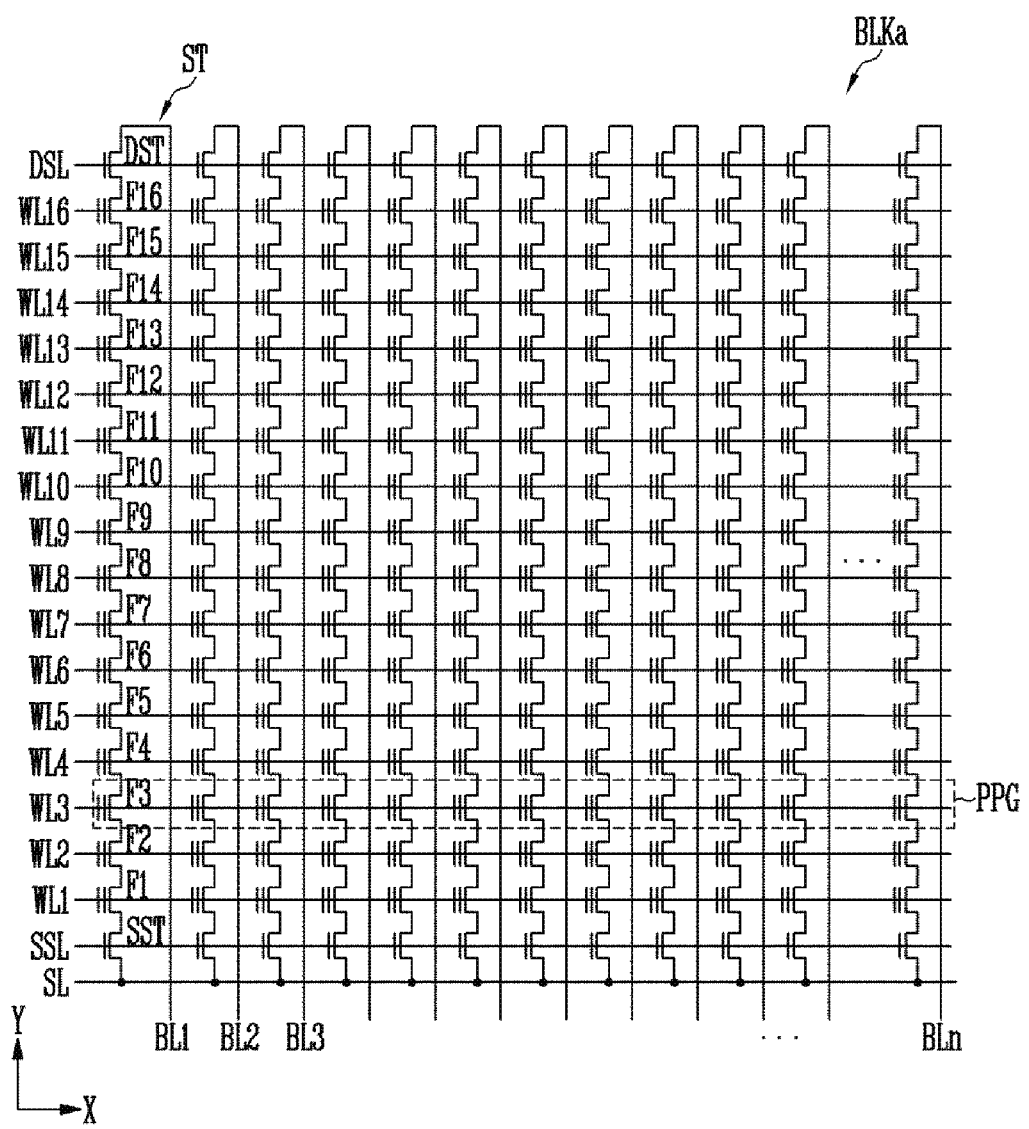
FIG. 3 is a diagram illustrating an embodiment of a memory cell array of FIG. 2.

FIG. 3 is a diagram illustrating an embodiment of the memory cell array of FIG. 2.

Referring to FIGS. 2 and 3, FIG. 3 is a circuit diagram showing any one memory block BLKa among the plurality of memory blocks BLK1 to BLKz included in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

More specifically, the memory block BLKa may include a plurality of strings connected between the bit lines BL1 to BLn and a source line SL. The bit lines BL1 to BLn may be connected to the strings, respectively, and the source line SL may be commonly connected to the strings. Because the strings may be configured to be identical to each other, a string ST connected to the first bit line BL1 will be specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the physical pages PPG of the number of the word lines WL1 to WL16.

One memory cell may store one bit of data. This is commonly referred to as a single level-cell (SLC). In this case, one physical page PPG may store one logical page (LPG) data. One logical page (LPG) data may include data bits of the number of memory cells included in one physical page PPG. In addition, one memory cell may store two or more bits of data. This is commonly referred to as a multi-level cell (MLC). In this case, one physical page PPG may store two or more logical page (LPG) data.

A memory cell in which two or more bits of data are stored in one memory cell is referred to as a multi-level cell (MLC), but recently, as the number of bits of data stored in one memory cell increases, the multi-level cell (MLC) refers to a memory cell in which two bits of data is stored, a memory cell in which three or more bits of data are stored is referred to as a triple-level cell (TLC), and a memory cell in which four or more bits of data are stored is referred to as a quadruple-level cell (QLC). In addition, a memory cell method in which a plurality of bits of data are stored has been developed, and the present embodiment may be applied to the memory device 100 in which two or more bits of data are stored.

In another embodiment, the memory block may have a three-dimensional structure. Each memory block includes a plurality of memory cells stacked on a substrate. Such plurality of memory cells are arranged along a +X direction, a +Y direction, and a +Z direction.

Figure 4:
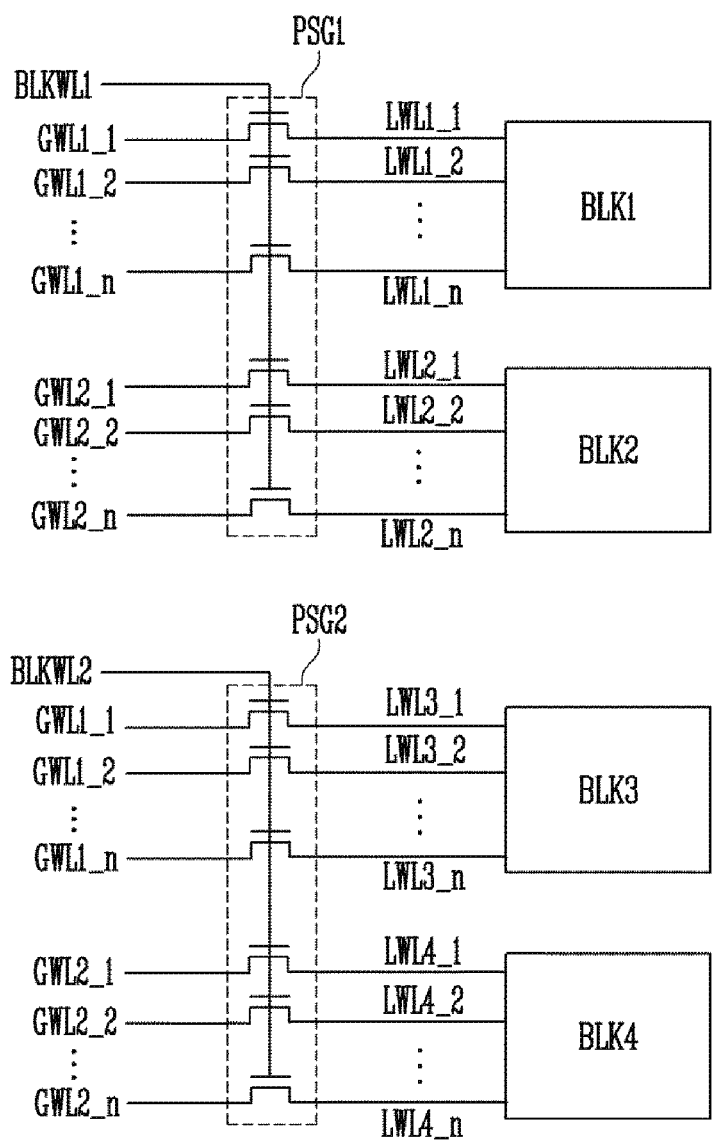
FIG. 4 is a diagram for describing a local word line, a global word line, and a block word line.

FIG. 4 is a diagram for describing a local word line, a global word line, and a block word line.

Referring to FIGS. 2 and 4, FIG. 4 shows first to fourth memory blocks BLK1 to BLK4 among the plurality of memory blocks BLK1 to BLKz of FIG. 2. In FIG. 4, it is assumed that the memory device 100 of FIG. 2 is a single plane structure. Therefore, the memory device (100 of FIG. 2) of FIG. 4 is a single plane structure, and a single plane may include the first to fourth memory blocks BLK1 to BLK4.

In an embodiment, the first memory block BLK1 may be connected to first_1 to first_n local word lines LWL1_1 to LWL1_n. That is, the plurality of memory cells included in the first memory block BLK1 may be connected to the first_1 to first_n local word lines LWL1_1 to LWL1_n.

Similarly, the second memory block BLK2 may be connected to second_1 to second_n local word lines LWL2_1 to LWL2_n, the third memory block BLK3 may be connected to third_1 to third_n local word lines LWL3_1 to LWL3_n, and the fourth memory block BLK4 may be connected to fourth_1 to fourth_n local word lines LWL4_1 to LWL4_n.

In an embodiment, first_1 to first_n global word lines GWL1_1 to GWL1_n may be selectively connected to the first and third memory blocks BLK1 and BLK3 through first and second pass switch groups PSG1 and PSG2. The second_1 to second_n global word lines GWL2_1 to GWL2_n may be selectively connected to the second and fourth memory blocks BLK2 and BLK4 through the first and second pass switch groups PSG1 and PSG2.

In an embodiment, the first pass switch group PSG1 may include a plurality of pass switches turned on or turned off in response to a voltage applied to a first block word line BLKWL1, and the plurality of pass switches may be formed of NMOS transistors. The second pass switch group PSG1 may include a plurality of pass switches turned on or turned off in response to a voltage applied to a second block word line BLKWL2, and the plurality of pass switches may be formed of NMOS transistors.

When a turn-on voltage is applied to the first and second block word lines BLKWL1 and BLKWL2 and the switches included in the first and second pass switch groups PSG1 and PSG2 are turned on, the first_1 to first_n global word lines GWL1_1 to GWL1_n may be commonly connected to the first and third memory blocks BLK1 and BLK3, and the second_1 to second_n global word lines GWL2_1 to GWL2_n may be commonly connected to the second and fourth memory blocks BLK2 and BLK4.

When the turn-on voltage is applied to the first block word line BLKWL1 and the turn-off voltage is applied to the second block word line BLKWL2, the pass switches included in the first pass switch group PSG1 may be turned on and the pass switches included in the second pass switch group PSG2 may be turned off. Therefore, the first_1 to first_n global word lines GWL1_1 to GWL1_n are connected to the first memory block BLK1 and are not connected to the third memory block BLK3. In addition, the second_1 to second_n global word lines GWL2_1 to GWL2_n are connected to the second memory block BLK2 and are not connected to the fourth memory block BLK4.

In contrast, when the turn-off voltage is applied to the first block word line BLKWL1 and the turn-on voltage is applied to the second block word line BLKWL2, the pass switches included in the first pass switch group PSG1 may be turned off and the pass switches included in the second pass switch group PSG2 may be turned on. Therefore, the first_1 to first_n global word lines GWL1_1 to GWL1_n are connected to the third memory block BLK3 and are not connected to the first memory block BLK1. In addition, the second_1 to second_n global word lines GWL2_1 to GWL2_n are connected to the fourth memory block BLK4 and are not connected to the second memory block BLK2.

As a result, the memory block may be selected based on the voltage applied to the block word line, and the operation voltage output from the voltage generator 122 of FIG. 2 may be transmitted to the selected memory block through the global word lines and the pass switch group.

Figure 5:
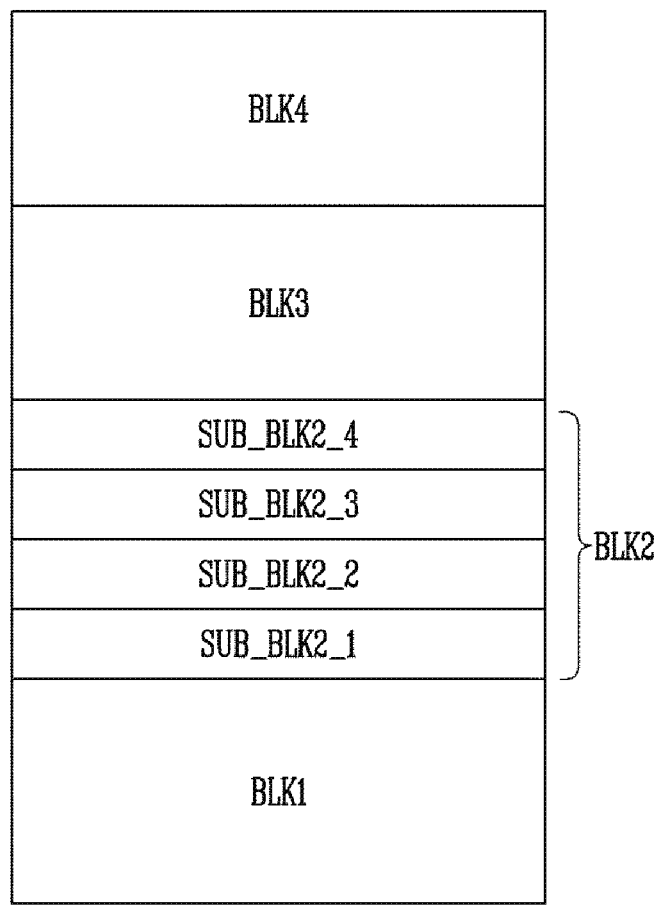
FIG. 5 is a diagram for describing a sub block.

FIG. 5 is a diagram for describing the sub block.

Referring to FIGS. 2 and 5, FIG. 5 shows first to fourth memory blocks BLK1 to BLK4 among the plurality of memory blocks BLK1 to BLKz included in the memory cell array 110 of FIG. 2. In FIG. 5, it is assumed that other memory blocks included in the memory cell array 110 of FIG. 2 are omitted.

Referring to FIG. 5, the second memory block BLK2 may be configured of second_1 to second_4 sub blocks SUB_BLK2_1 to 2_4. In FIG. 5, only the second memory block BLK2 is divided into a sub block unit, but the first, third, and fourth memory blocks BLK1, BLK3, and BLK4 may also be divided into the sub blocks.

In an embodiment, the program operation, the read operation, or the erase operation may be performed on the first to fourth memory blocks BLK1 to BLK4.

The program operation or the read operation is performed in a page unit, but the erase operation is performed in a memory block unit. That is, the first to fourth memory blocks BLK1 to BLK4 may be configured of a plurality of pages, and the program operation or the read operation may be performed on any one of the plurality of pages. In addition, the erase operation may be performed on each of the first to fourth memory blocks BLK1 to BLK4.

However, as the memory device 100 of FIG. 2 is implemented as a three-dimensional array structure, and the number of stacked layers increases, the size of the memory block increases. That is, when the memory device 100 of FIG. 2 is implemented in the three-dimensional array structure, the size of each memory block included in the memory device 100 of FIG. 2 may be increased. Therefore, because it may be uneconomical to erase the entire memory block of which the size is increased, the erase operation is required to be performed in the sub block unit.

Therefore, the memory device 100 of FIG. 2 may divide the memory block into the sub block and perform the erase operation on the sub block.

However, when the erase operation is performed in the sub block unit, a disturb phenomenon and a change of the threshold voltage distribution may occur in the sub block adjacent to the sub block on which the erase operation is performed.

For example, when the memory device 100 of FIG. 2 performs the erase operation on the second_2 sub block SUB_BLK2_2, the disturb phenomenon may occur in the second_1 and second_3 sub blocks SUB_BLK2_1 and 2_3 which are the adjacent sub blocks or the threshold voltage distribution of the memory cells included in the second_1 and second_3 sub blocks SUB_BLK2_1 and 2_3 may change.

In an embodiment, during the erase operation on the second_2 sub block SUB_BLK2_2, when the erase voltage is applied to the second_2 sub block SUB_BLK2_2, the threshold voltage distribution of the memory cells may be changed, due to movement of charges in a gate of the memory cells included in the second_1 and second_3 sub blocks SUB_BLK2_1 and 2_3 which are the adjacent sub blocks or an unexpected disturb phenomenon.

Therefore, in order to prevent the change of the threshold voltage distribution of the memory cells, the memory device 100 of FIG. 2 is required to control the floating time point of word lines connected to the second_1 and second_3 sub blocks SUB_BLK2_1 and 2_3 which are the adjacent sub blocks.

That is, the memory device 100 of FIG. 2 may adjust a time point at which the voltage is applied to the word lines connected to the second_1 and second_3 sub blocks SUB_BLK2_1 and 2_3 which are the adjacent sub blocks to differently set a time point at which each of the word lines are floated. The memory device 100 of FIG. 2 may set the voltage applied to the word lines adjacent to the sub block on which the erase operation is performed to be relatively lower than a voltage applied to the word line of the center by adjusting the floating time point of each of the word lines.

Figure 6:
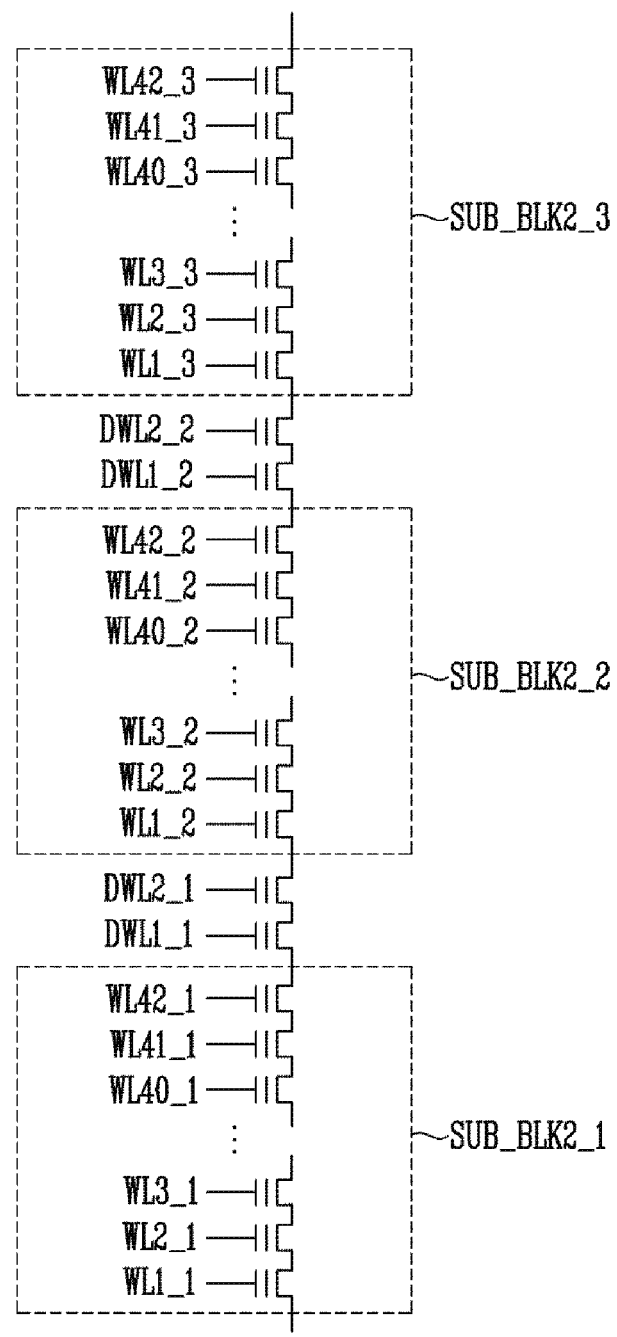
FIG. 6 is a diagram for describing an effect on an adjacent sub block during an erase operation on the sub block.

FIG. 6 is a diagram for describing an effect on the adjacent sub block during the erase operation on the sub block.

Referring to FIG. 6, FIG. 6 shows the second_1 and second_3 sub blocks SUB_BLK2_1 and 2_3 among the sub blocks included in the second memory block BLK2 of FIG. 5. The plurality of word lines may be connected to each sub block.

In FIG. 6, 42 word lines are connected to each sub block, but in another embodiment, fewer or more word lines may be connected to each sub block.

In an embodiment, first_1 to forty-second_1 word lines WL1_1 to 42_1 may be connected to the second_1 sub block SUB_BLK2_1, first_2 to forty-second_2 word lines WL1_2 to 42_2 may be connected to the second_2 sub block SUB_BLK2_2, and first_3 to forty-second_3 word lines WL1_3 to 42_3 may be connected to the second_3 sub block SUB_BLK2_3.

In addition, the second_1 sub block SUB_BLK2_1 and the second_2 sub block SUB_BLK2_2 may be divided into first_1 and second_1 dummy word lines DWL1_1 and DWL2_1, and the second_2 sub block SUB_BLK2_2 and the second_3 sub block SUB_BLK2_3 may be divided into first_2 and second_2 dummy word lines DWL1_2 and DWL2_2. At this time, the program operation, the read operation, or the erase operation may not be performed on memory cells connected to the dummy word lines.

In an embodiment, the erase operation may be performed on the second_1 sub block SUB_BLK2_1. As the erase voltage is applied to a substrate of the second_1 sub block SUB_BLK2_1 during the erase operation, the threshold voltage distribution of the memory cells included in the second_2 sub block SUB_BLK2_2 adjacent to the second_1 sub block SUB_BLK2_1 may be changed. That is, a charge of the memory cells included in the second_2 sub block SUB_BLK2_2 adjacent to the second_1 sub block SUB_BLK2_1 may be moved by the erase voltage.

As a result, during the erase operation on the second_1 sub block SUB_BLK2_1, the threshold voltage distribution of the memory cells included in the adjacent second_2 sub block SUB_BLK2_2 may be changed.

In addition, as the erase operation is performed on the second_1 sub block SUB_BLK2_1, a disturb phenomenon may occur in the memory cells included in the adjacent second_2 sub block SUB_BLK2_2.

In an embodiment, the erase operation may be performed on the second_2 sub block SUB_BLK2_2. As the erase voltage is applied to a substrate of the second_2 sub block SUB_BLK2_2 during the erase operation, the threshold voltage distribution of the memory cells included in the second_1 and second_3 sub blocks SUB_BLK2_1 and 2_3 adjacent to the second_2 sub block SUB_BLK2_2 may be changed. That is, a charge of the memory cells included in the second_1 and second_3 sub blocks SUB_BLK2_1 and 2_3 adjacent to the second_2 sub block SUB_BLK2_2 may be moved by the erase voltage.

As a result, during the erase operation on the second_2 sub block SUB_BLK2_2, the threshold voltage distribution of the memory cells included in the adjacent second_1 and second_3 sub blocks SUB_BLK2_1 and 2_3 may be changed.

In addition, as the erase operation is performed on the second_2 sub block SUB_BLK2_2, a disturb phenomenon may occur in the memory cells included in the adjacent second_1 and second_3 sub blocks SUB_BLK2_1 and 2_3.

In an embodiment, the erase operation may be performed on the second_3 sub block SUB_BLK2_3. As the erase voltage is applied to a substrate of the second_3 sub block SUB_BLK2_3 during the erase operation, the threshold voltage distribution of the memory cells included in the second_2 sub block SUB_BLK2_2 adjacent to the second_3 sub block SUB_BLK2_3 may be changed. That is, a charge of the memory cells included in the second_2 sub block SUB_BLK2_2 adjacent to the second_3 sub block SUB_BLK2_3 may be moved by the erase voltage.

As a result, during the erase operation on the second_3 sub block SUB_BLK2_3, the threshold voltage distribution of the memory cells included in the adjacent second_2 sub block SUB_BLK2_2 may be changed.

In addition, as the erase operation is performed on the second_3 sub block SUB_BLK2_3, a disturb phenomenon may occur in the memory cells included in the adjacent second_2 sub block SUB_BLK2_2.

As a result, when the memory device 100 of FIG. 2 performs the erase operation in the sub block unit, the threshold voltage distribution of the memory cells included in the sub block adjacent to the sub block on which the erase operation is performed may be changed. Therefore, in the present disclosure, a method of preventing the threshold voltage distribution of the memory cells included in the adjacent sub block from being changed during the erase operation in the sub block unit is proposed.

Figure 7:
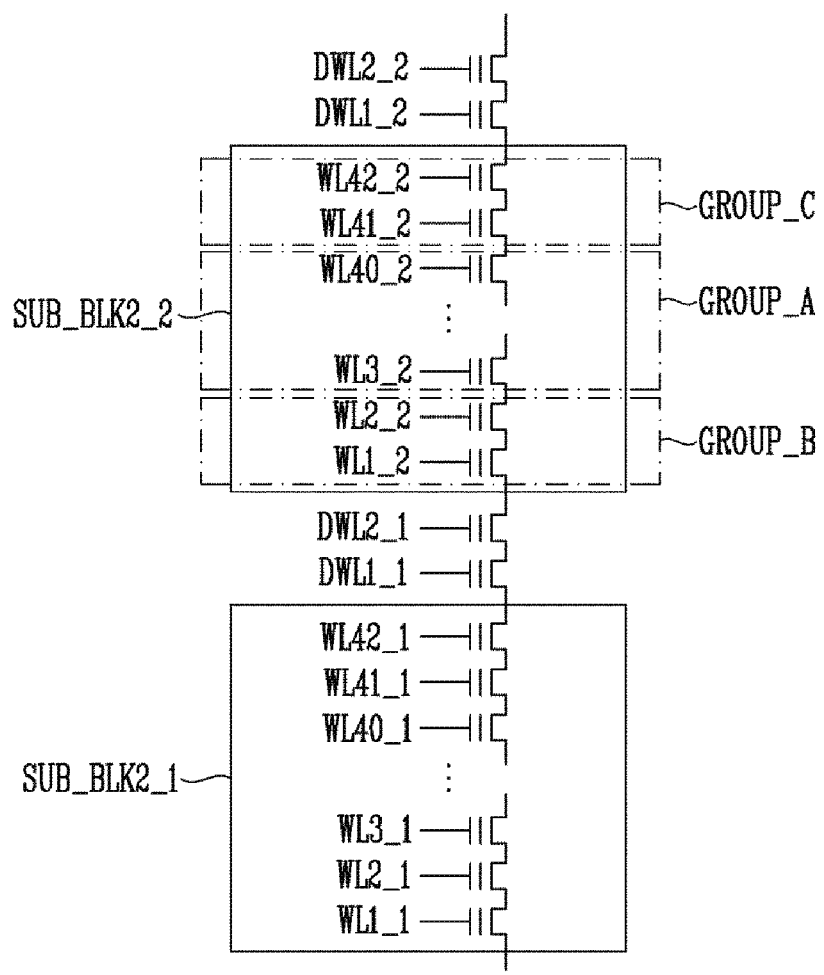
FIG. 7 is a diagram for describing an embodiment of controlling a floating time point according to an embodiment of the present disclosure during the erase operation on the sub block.

FIG. 7 is a diagram for describing an embodiment of controlling the floating time point according to an embodiment of the present disclosure during the erase operation on the sub block.

Referring to FIGS. 6 and 7, FIG. 7 shows the second_1 and second_2 sub blocks SUB_BLK2_1 and 2_2 among the sub blocks of FIG. 6 and the dummy word lines DWL1_1, DWL2_1, DWL1_2, and DWL2_2.

In FIG. 7, it is assumed that the memory device 100 of FIG. 2 performs the erase operation on the second_1 sub block SUB_BLK2_1.

In the present disclosure, when the erase operation is performed on the second_1 sub block SUB_BLK2_1, in order to prevent the change of threshold voltage distribution and the disturb phenomenon of the memory cells included in the second_2 sub block SUB_BLK2_2 adjacent to the second_1 sub block SUB_BLK2_1, the second_2 sub block SUB_BLK2_2 may be divided into the sub blocks.

In an embodiment, the erase operation may be performed on the second_1 sub block SUB_BLK2_1. When the erase operation is performed on the second_1 sub block SUB_BLK2_1, the word lines connected to the adjacent sub block SUB_BLK2_2 may be floated. However, in the related art, as the word lines connected to the sub block adjacent to the sub block on which the erase operation is performed are simultaneously floated, distribution of a threshold voltage of the memory cells included in the adjacent sub block may be changed.

Therefore, it is necessary to divide the word lines connected to the second_2 sub block SUB_BLK2_2 into a plurality of groups to set differently a floated time point for each word line and to set differently a level of applied voltages for each word line.

In an embodiment, because the word lines connected to the second_2 sub blocks SUB_BLK2_2 are the first_2 to forty-second_2 word lines WL1_2 to WL42_2, the word line positioned at the most center among the word lines connected to the second_2 sub blocks SUB_BLK2_2 may be a twenty-first_2 word line WL21_2 or a twenty-second_2 word line WL22_2.

In FIG. 7, it is assumed that the word line positioned at the most center among the word lines connected to the second_2 sub block SUB_BLK2_2 is the twenty-first_2 word line WL21_2. In addition, the twenty-first_2 word line WL21_2 positioned at the most center may be the center word line.

Further, among the word lines connected to the second_2 sub block SUB_BLK2_2, edge word lines may be the first_2 and forty-second_2 word lines WL1_2 and WL42_2. The first_2 and forty-second_2 word lines WL1_2 and WL42_2 may be the edge word lines.

In an embodiment, the word lines connected to the second_2 sub blocks SUB_BLK2_2 may be divided into A to C groups GROUP_A to C. For example, the word lines including the twenty-first_2 word line WL21_2 which is the center word line may be divided into the A group GROUP_A. In addition, the B and C groups GROUP_B and C may be set to include the same number of word lines as a group adjacent to the A group GROUP_A.

Although not shown in the present drawing, in another embodiment, the B and C groups GROUP_B and C may include different numbers of word lines.

When the second_2 sub block SUB_BLK2_2 adjacent to the second_1 sub block SUB_BLK2_1 on which the erase operation is performed is divided into the A to C groups GROUP_A to C, the time point at which the word lines of each group are floated may be determined.

At this time, when the floating time of the word lines is too fast, a disturb phenomenon occurs at the edge word lines among the word lines connected to the sub blocks adjacent to the sub block on which the erase operation is performed. In addition, when the floating time of the word lines is too slow, the memory cells connected to the word lines may be erased. Therefore, the floating time point is required to be controlled.

For example, it may be determined that the word lines of the A group GROUP_A including the center word line are first floated and the B and C groups GROUP_B and C adjacent to the A group GROUP_A are simultaneously floated. When the word lines of the A group GROUP_A are floated and then the word lines of the B and C group GROUP_B and C are simultaneously floated, the threshold voltage of the memory cells of the A group GROUP_A may be highest and the threshold voltage may be sequentially lowered toward the memory cells of the B and C groups GROUP_B and C. Through this, the change of the threshold voltage distribution of the memory cells of the second_2 sub block SUB_BLK2_2 may be prevented and the disturb phenomenon may be prevented.

The threshold voltage distribution formed by the memory cells of the A to C groups GROUP_A to C will be described in more detail with reference to FIGS. 8A and 8B.

Figure 8A:
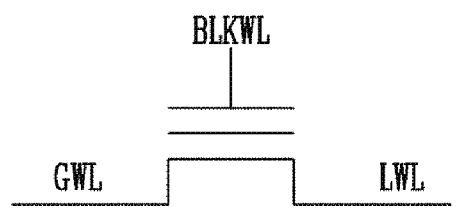
FIGS. 8A and 8B are diagram for describing a time point at which a voltage is applied to each global word line and a voltage change of a local word line according to FIG. 7.
Figure 8B:
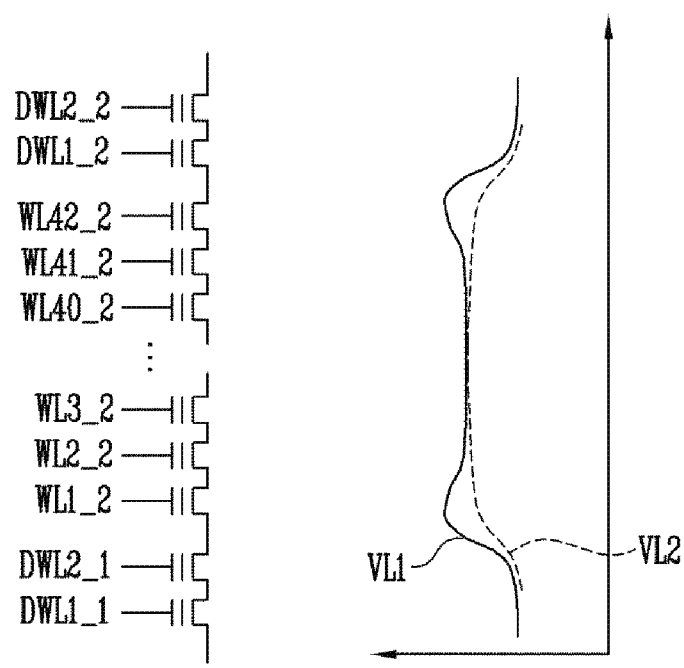

FIGS. 8A and 8B are diagram for describing a time point at which a voltage is applied to each global word line and a voltage change of a local word line according to FIG. 7.

Referring to FIGS. 4, 8A and 8B, FIG. 8A shows any one of pass switches connected to the first to fourth memory blocks BLK1 to BLK4 of FIG. 4. The pass switch may be implemented with an NMOS transistor.

Referring to FIGS. 7, 8A and 8B, FIG. 8B shows dividing the second_2 sub block SUB_BLK2_2 into the A to C groups GROUP_A to C and a magnitude of a potential formed in each word line when controlling the floating time point for each group, during the erase operation on the second_1 sub block SUB_BLK2_1 of FIG. 7.

In the related art, when the word lines connected to the adjacent sub blocks are simultaneously floated during the erase operation on the sub block, that is, when the floating time point of the word lines is not controlled for each group, a voltage formed in each word line may be formed as a VL1 line.

That is, because the program operation, the read operation, or the erase operation is not performed on the dummy word lines, a relatively low voltage is maintained, a relatively high voltage is maintained in the edge word line of the sub block, and a voltage lower than the voltage of the edge word lines is maintained at the word lines positioned at the center of the sub block.

However, due to the erase operation on the sub block, the threshold voltage distribution of the memory cells included in the adjacent sub block may be changed and the disturb phenomenon may occur. Therefore, a potential distribution of the word lines is required to be formed in a distribution such as a VL2 line.

Referring to FIG. 8A, the voltage distribution such as the VL2 line is required to be formed in a local word line LWL. Therefore, a voltage applied to a global word line GWL is required to be controlled so that the voltage distribution such as the VL2 line is formed in the local word line LWL.

Referring to FIGS. 7, 8A and 8B, when controlling the floating time point of the A to C groups GROUP_A to C included in the second_2 sub block SUB_BLK2_2, the voltage distribution such as the VL2 line may be formed.

In FIG. 8B, a potential of the word lines positioned at the center among the word lines connected to the second_2 sub block SUB_BLK2_2 may be high by first floating the A group GROUP_A including the center word line.

Thereafter, the potential may be sequentially lowered from the word lines positioned in the center toward the word line positioned at the edge by simultaneously floating the word lines included in the B and C groups GROUP_B and C adjacent to the A group GROUP_A.

As a result, the high potential may be formed in the word line at the center portion and the potential may be lowered toward from the center portion to the edge by dividing the word lines connected to the sub block adjacent to the sub block on which the erase operation is performed into the group and controlling the floating time point for each group.

Figure 9:
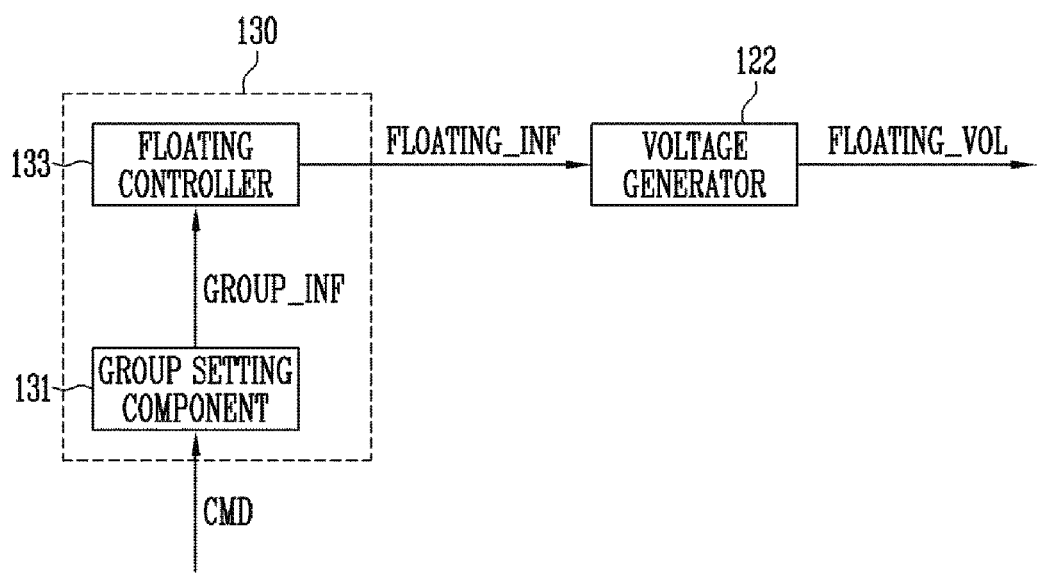
FIG. 9 is a diagram illustrating an operation of control logic and a voltage generator in the memory device for controlling the floating time point according to the present disclosure.

FIG. 9 is a diagram illustrating the operation of the control logic and the voltage generator in the memory device for controlling the floating time point according to the present disclosure.

Referring to FIGS. 2 and 9, the control logic 130 of FIG. 9 may include the group setting component 131 and the floating controller 133.

In an embodiment, the control logic 130 may receive the command CMD from the memory controller 200 of FIG. 1 through the input/output circuit 125 of FIG. 2. When the received command CMD is a partial erase command, the group setting component 131 may generate group information GROUP_INF. At this time, the partial erase command may be a command CMD instructing to erase some of the plurality of sub blocks included in the memory device 100 of FIG. 2, not erase the entire memory device 100 of FIG. 2.

In an embodiment, the group setting component 131 may divide the plurality of word lines connected to the adjacent sub block neighboring the sub block on which the erase operation is performed into the plurality of groups in response to the partial erase command.

For example, the group setting component 131 may set the group including the word line positioned at the most center of the plurality of word lines connected to the adjacent sub block to the first group and set the groups including the word lines adjacent to the first group to the second group and the third group, respectively. The group setting component 131 may output the group information GROUP_INF indicating the set groups to the floating controller 133.

In another embodiment, the group setting component 131 may set the group including the word line positioned at the most center among the plurality of word lines connected to the adjacent sub blocks to the first group, set the groups including the word lines adjacent to the first group to the second group and the third group, respectively, set word lines adjacent to the second group among residual word lines to a fourth group when the residual word lines, which are adjacent to the second group and the third group but are not included in the first group, are present, and set word lines adjacent to the third group among the residual word lines to a fifth group. Also at this time, the group setting component 131 may output the group information GROUP_INF indicating the set group to the floating controller 133.

In an embodiment, the floating controller 133 may receive the group information GROUP_INF from the group setting component 131, generate floating information FLOATING_INF instructing to control a floating operation for each group, and output the floating information FLOATING_INF to the voltage generator 122.

Specifically, the floating controller 133 may instruct to differently set the floating time point of the word lines included in each group for each of the plurality of groups. For example, when the plurality of word lines connected to the adjacent sub block are divided into the first to third groups, the floating controller 133 may control the voltage generator 122 to first float the word lines included in the first group. That is, the floating information FLOATING_INF instructing to first float the word lines included in the first group may be generated and output to the voltage generator 122.

Thereafter, the floating controller 133 may control the voltage generator 122 to simultaneously float the word lines included in the second group and the third group after the word lines included in the first group are first floated. That is, the floating information FLOATING_INF instructing to float the word lines included in the second group and the third group after the word lines included in the first group are first floated may be generated and output to the voltage generator 122.

When the voltage generator 122 receives the floating information FLOATING_INF from the floating controller 133, the voltage generator 122 may generate a floating voltage FLOATING_VOL.

For example, the voltage generator 122 may first generate a voltage for floating the word lines included in the first group, and then apply the voltage to the word lines included in the first group. Thereafter, the voltage generator 122 may generate a voltage for floating the word lines included in the second group and the third group, and then apply the voltage to the word lines included in the second group and the third group.

At this time, a voltage maintained in the word lines included in the first group as the word lines included in the first group are floated may be greater than a voltage maintained in the word lines included in the second group and the third group as the word lines included in the second group and the third group are floated. In addition, the voltage maintained in the word lines included in the second group and the third group as the word lines included in the second group and the third group are floated may be greater than the erase voltage during the erase operation.

After the word lines included in the second group and the third group are simultaneously floated, the floating controller 133 may control the voltage generator 122 to float the dummy word lines connected between the sub block on which the erase operation is performed and the adjacent sub block.

In an embodiment, when the plurality of word lines connected to the adjacent sub block are divided into the first to fifth groups, the floating controller 133 may receive the group information GROUP_INF from the group setting component 131, and may control the voltage generator 122 to first float the word lines included in the first group and then simultaneously float the word lines included in the second group and the third group. Thereafter, after the word lines included in the second group and the third group are simultaneously floated, the floating controller 133 may control the voltage generator 122 to simultaneously float the word lines included in the fourth group and the fifth group.

At this time, the voltage maintained in the word lines included in the first group as the word lines included in the first group are floated may be greater than the voltage maintained in the word lines included in the second group and the third group as the word lines included in the second group and the third group are floated. In addition, the voltage maintained in the word lines included in the second group and the third group as the word lines included in the second group and the third group are floated may be greater than a voltage maintained in the word lines included in the fourth group and the fifth group as the word lines included in the fourth group and the fifth group are floated.

Figure 10:
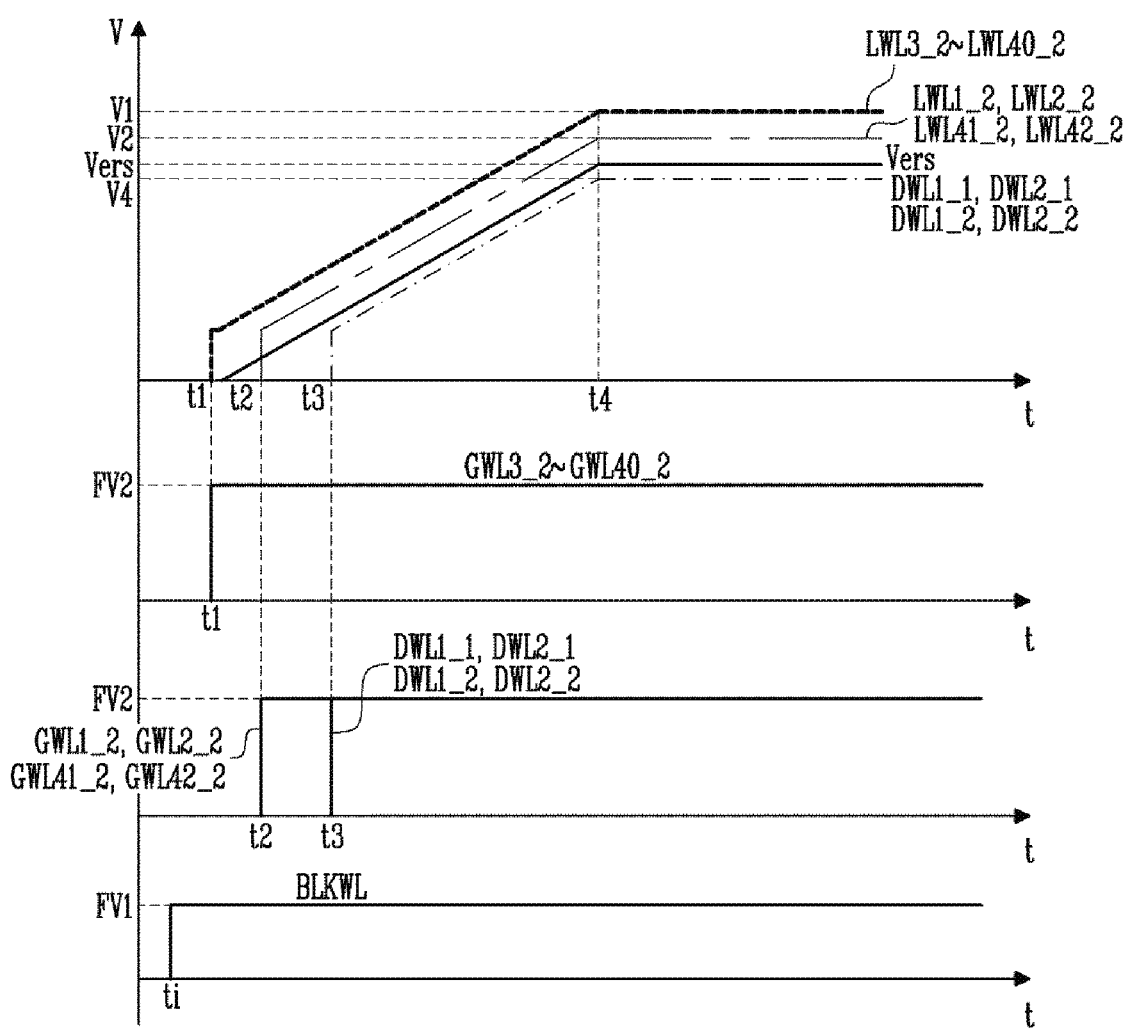
FIG. 10 is a diagram illustrating a voltage distribution applied to a word line by controlling the floating time point according to the present disclosure.

FIG. 10 is a diagram illustrating the voltage distribution applied to the word line by controlling the floating time point according to the present disclosure.

Referring to FIGS. 7 to 10, FIG. 10 shows a method of dividing the word lines connected to the second_2 sub block SUB_BLK2_2 of FIG. 7 into the plurality of groups and differently setting the floating time point for each group.

Specifically, at ti, in order to turn on the plurality of pass switches, a first floating voltage FV1 (for example, 4.5V) may be applied to a block word line BLKWL.

That is, in order to select the sub block adjacent to the sub block on which the erase operation is performed, first, voltages for turning on the pass switches may be applied to the block word line BLKWL. When the first floating voltage FV1 is applied to the block word line BLKWL, the global word lines connected to the sub block adjacent to the sub block on which the erase operation is performed may be connected to each of the sub blocks.

Thereafter, among the word lines included in the A to C groups GROUP_A to C, the word lines included in the A group GROUP_A may be first floated. Therefore, at t1, in order to float third_2 to fortieth_2 word lines WL3_2 to WL40_2 included in the A group GROUP_A, a second floating voltage FV2 (for example, 7V) may be applied to third_2 to fortieth_2 global word lines GWL3_2 to GWL40_2.

When the second floating voltage FV2 is applied to the third_2 to fortieth_2 global word lines GWL3_2 to GWL40_2 at t1, a potential of third_2 to fortieth_2 local word lines LWL3_2 to LWL40_2 may be floated. At t4, the potential of the third_2 to fortieth_2 local word lines LWL3_2 to LWL40_2 may be a V1 level.

After the word lines included in the A group GROUP_A are first floated, the word lines of the B and C groups GROUP_B and C may be simultaneously floated at t2. Therefore, at t2, in order to float the first_2, second_2, forty-first_2, and forty-second_2 word lines WL1_2, WL2_2, WL41_2, and WL42_2 included in the B and C groups GROUP_B and C, the second floating voltage FV2 may be applied to first_2, second_2, forty-first_2, and forty-second_2 global word lines GWL1_2, GWL2_2, GWL41_2, and GWL42_2.

When the second floating voltage FV2 is applied to the first_2, second_2, forty-first_2, and forty-second_2 global word lines GWL1_2, GWL2_2, GWL41_2, and GWL42_2 at t2, a potential of first_2, second_2, forty-first_2, and forty-second_2 local word lines LWL1_2, LWL2_2, LWL41_2, and LWL42_2 may be floated. At t4, the potential of the first_2, second_2, forty-first_2, and forty-second_2 local word lines LWL1_2, LWL2_2, LWL41_2, and LWL42_2 may be a V2 level. The V2 level may be lower than the V1 level and higher than an erase voltage level Vers.

After simultaneously floating the word lines of the B and C groups GROUP_B and C, the dummy word lines may be floated at t3. When the second floating voltage FV2 is applied to first_1, first_2, second_1, and second_2 dummy word lines DWL1_1, DWL1_2, DWL2_1, and DWL2_2 at t3, a potential of the first_1, first_2, second_1, and second_2 dummy word lines DWL1_1, DWL1_2, DWL2_1, and DWL2_2 may may be floated. At t4, the potential of the first_1, first_2, second_1, and second_2 dummy word lines DWL1_1, DWL1_2, DWL2_1, and DWL2_2 may be a V4 level. The V4 level may be lower than the erase voltage level Vers.

As a result, through the above process, the potential such as VL2 of FIG. 8B may be formed. As described above, when the floating time point of the word lines connected to the sub block adjacent to the sub block on which the erase operation is performed is controlled, the disturb phenomenon and the change of the threshold voltage distribution of the memory cells may be prevented.

In another embodiment, the voltage applied to each global word line may be variously set in order to float the word lines connected to the sub block adjacent to the sub block on which the erase operation is performed.

Figure 11A:
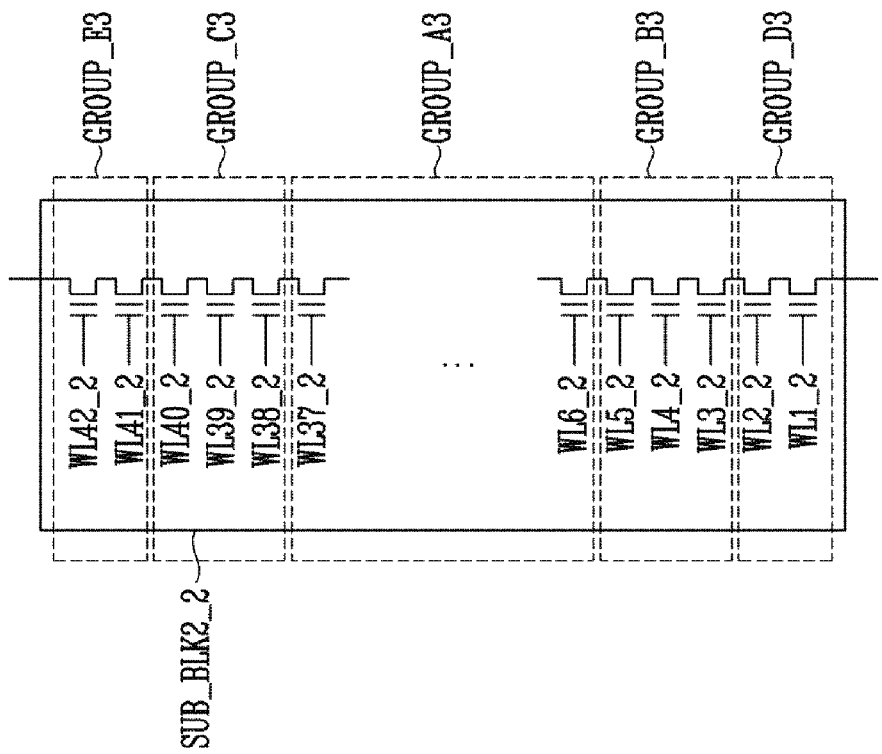
FIGS. 11A and 11B are diagram for describing another embodiment of dividing the sub block into groups to control the floating time point according to an embodiment of the present disclosure.
Figure 11B:
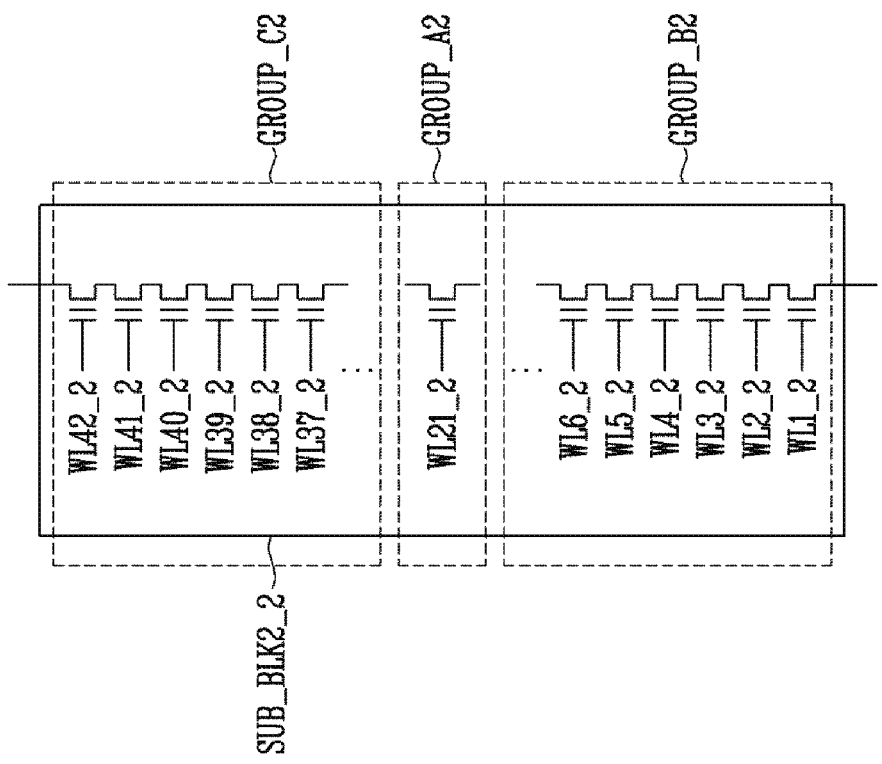

FIGS. 11A and 11B are diagram for describing another embodiment of dividing the sub block into groups to control the floating time point according to an embodiment of the present disclosure.

Referring to FIGS. 7, 11A and 11B, FIG. 11A show the second_2 sub block SUB_BLK2_2 of FIG. 7. In FIGS. 11A and 11B, differently from FIG. 7, the number of word lines included in each group and/or the number of groups configuring the second_2 sub block SUB_BLK2_2 of FIG. 7 may be different. Similarly to FIG. 7, it is assumed that the center word line is the twenty-first_2 word line WL21_2.

In FIGS. 11A and 11B, the threshold voltage distribution change and the disturb phenomenon may be prevented by dividing the word lines connected to the sub block adjacent to the sub block on which the erase operation is performed into the plurality of groups and controlling the floating time point for each group. At this time, the number of word lines included in the plurality of groups may be various.

FIG. 11A shows a case where an A2 group GROUP_A2 includes only one word line.

Therefore, first, the second_2 sub block SUB_BLK2_2 may be divided into the A2 group GROUP_A2 including the twenty-first_2 word line WL21_2 which is the center word line. Thereafter, the second_2 sub block SUB_BLK2_2 may be divided into B2 and C2 groups GROUP_B2 and C2 adjacent to the A2 group GROUP_A2. In an embodiment, the B2 group GROUP_B2 may include first_2 to twentieth_2 word lines WL1_2 to WL20_2, and the C2 group GROUP_C2 may include twenty-second_2 to forty-second_2 word lines WL22_2 to WL42_2.

As a result, differently from FIG. 7, the groups of FIG. 11A may be divided into the A2 group GROUP_A2 including only the center word line and the B2 and C2 groups GROUP_B2 and C2 adjacent to the A2 group GROUP_A2. When the second_2 sub block SUB_BLK2_2 is divided into the A2 to C2 groups GROUP_A2 to C2, the floating time point of the word lines of each group may be identically controlled.

That is, after the word lines of the A2 group GROUP_A2 are floated, the memory device may simultaneously float the word lines of the B2 and C2 groups GROUP_B2 and C2.

FIG. 11B shows a case where the number of groups configuring the second_2 sub block SUB_BLK2_2 of FIG. 7 is five.

Therefore, first, the second_2 sub block SUB_BLK2_2 may be divided into an A3 group GROUP_A3 including the twenty-first_2 word line WL21_2 which is the center word line. The A3 group GROUP_A3 may include sixth_2 to thirty-seventh_2 word lines WL6_2 to WL37_2 by including the twenty-first_2 word line WL21_2 which is the center word line.

Thereafter, the second_2 sub block SUB_BLK2_2 may be divided into B3 and C3 groups GROUP_B3 and C3 adjacent to the A3 group GROUP_A3, and may be divided into D3 and E3 groups GROUP_D3 and E3 adjacent to the B3 and C3 groups GROUP_B3 and C3. Here, the number of word lines included in each of the B3 and C3 groups GROUP_B3 and C3 and the number of word lines included in each of the D3 and E3 groups GROUP_D3 and E3 may be the same.

Although not shown in the present drawing, in another embodiment, the number of word lines included in each of the B3 and C3 groups GROUP_B3 and C3 and the number of word lines included in each of the D3 and E3 groups GROUP_D3 and E3 may be different from each other.

In an embodiment, the B3 group GROUP_B3 may include third_2 to fifth_2 word lines WL3_2 to WL5_2, and the C3 group GROUP_C3 may include thirty-eighth_2 to fortieth_2 word lines WL38_2 to WL40_2. Therefore, the number of word lines included in each of the B3 and C3 groups GROUP_B3 and C3 may be the same.

In an embodiment, the D3 group GROUP_D3 may include first_2 and second_2 word lines WL1_2 and WL2_2, and the E3 group GROUP_E3 may include forty-first_2 and forty-second_2 word lines WL41_2 to WL42_2. Therefore, the number of word lines included in each of the D3 and E3 groups GROUP_D3 and E3 may be the same.

As a result, different from FIG. 7, the groups of FIG. 11B may be divided into the A3 group GROUP_A3 including the center word line, the B3 and C3 groups GROUP_B3 and C3 adjacent to the A3 group GROUP_A3, and the D3 and E3 groups GROUP_D3 and E3 adjacent to the B3 and C3 groups GROUP_B3 and C3. When the second_2 sub block SUB_BLK2_2 is divided into the A3 to E3 groups GROUP_A3 to E3, the floating time point of the word lines of each group may be identically controlled.

That is, after the word lines of the A3 group GROUP_A3 are floated, the memory device may simultaneously float the word lines of the B3 and C3 groups GROUP_B3 and C3. Thereafter, after the word lines of the B3 and C3 groups GROUP_B3 and C3 are floated, the word lines of the D3 and E3 groups GROUP_D3 and E3 may be simultaneously floated.

When the word lines of each group are floated, the potential may be sequentially decreased from the word line positioned at the center to the edge word line.

In another embodiment, the sub blocks adjacent to the sub block on which the erase operation is performed may be divided into various numbers of groups, and the number of word lines included in each group may be various.

Figure 12:
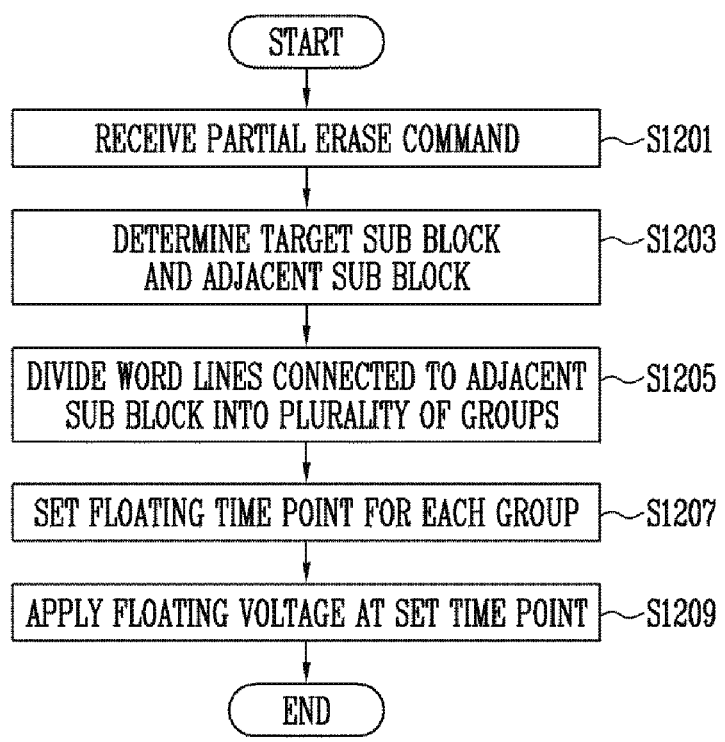
FIG. 12 is a diagram for describing an operation of the memory device according to an embodiment of the present disclosure.

FIG. 12 is a diagram for describing an operation of the memory device according to an embodiment of the present disclosure.

Referring to FIG. 12, in step S1201, the memory device may receive the partial erase command from the outside. The partial erase command may be the command instructing to erase some of the plurality of sub blocks included in the memory device, not erase the entire memory device. As the size of the memory block increases, erasure of a portion of the memory block is necessary, and thus the memory device may perform the erase operation in the sub block unit.

In step S1203, the memory device may determine the target sub block and the adjacent sub block.

Specifically, the memory device may determine the target sub block on which the partial erase operation is performed. When the target sub block is determined and the erase operation is performed on the target sub block, the memory cells included in the adjacent sub block may be affected by the erase operation performed on the target sub block. Here, the adjacent sub block may be a sub block adjacent to the target sub block. Therefore, the memory device may determine the adjacent sub block for controlling the floating time point.

In step S1205, when the target sub block and the adjacent sub block are determined, the memory device may divide the word lines connected to the adjacent sub block into the plurality of groups. For example, the memory device may set the group including the word line positioned at the most center, that is the center word line among the word lines connected to the adjacent sub block to the first group and set groups configured of the same number of word lines most adjacent to the first group to adjacent groups. The groups adjacent to the first group may be the second and third groups.

In step S1207, the memory device may set the floating time point for each group. For example, it may be determined that the word lines included in the first group including the center word line are first floated. Next, the word lines included in the two groups adjacent to the group including the center word line, that is, the word lines included in the second and third groups may be determined as the word lines to be floated next.

In such a manner, the memory device may set the floating time point of the word line slowly from the group including the center word line to the group of the edge.

In step S1209, at the floating time point set for each group, the memory device may apply a floating voltage to the word lines of each group. The potential level of the word lines may be sequentially lowered from the word line positioned at the center toward the word line positioned at the edge, by differently setting the floating time point.

Figure 13:
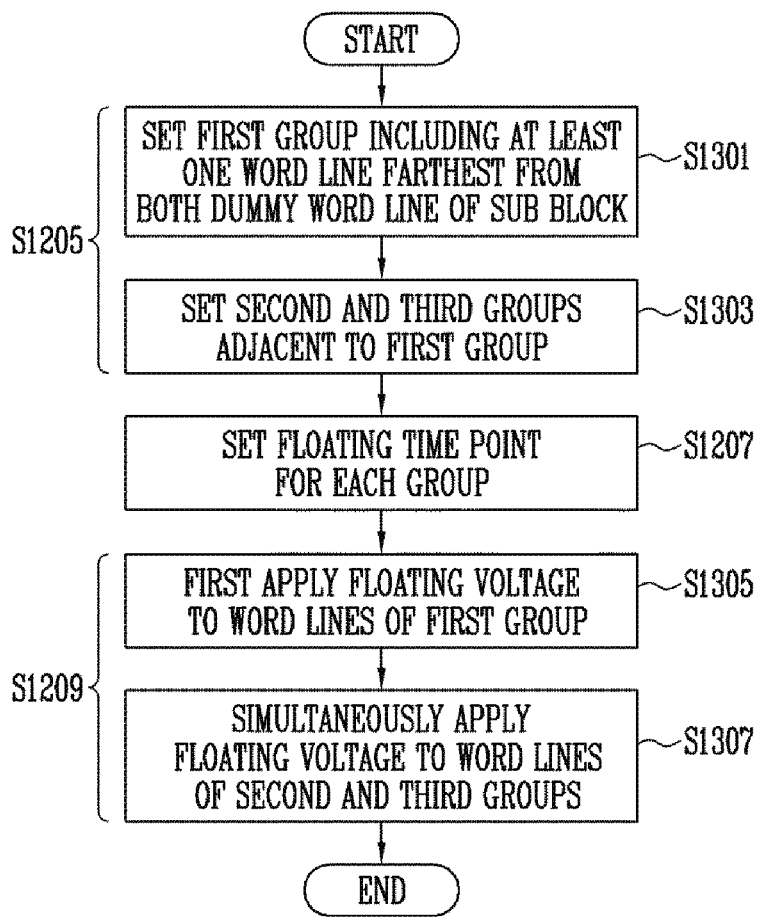
FIG. 13 is a diagram for describing the operation of the memory controller according to an embodiment of the present disclosure.

FIG. 13 is a diagram for describing the operation of the memory device according to an embodiment of the present disclosure.

Referring to FIGS. 12 and 13, steps S1301 and S1303 are steps in which step S1205 is subdivided, and steps S1305 and S1307 are steps in which step S1209 is subdivided.

In step S1301, the memory device may set the first group including at least one word line furthest from both dummy word lines of the sub block. That is, the memory device may set the first group including the word line positioned at the center among the word lines connected to the sub block adjacent to the sub block on which the erase operation is performed. Therefore, the first group may include at least one word line by including the center word line.

In step S1303, the memory device may set the second and third groups adjacent to the first group. In an embodiment, the number of word lines included in the second and third groups may be the same.

Although not shown in the present drawing, in an embodiment, the fourth and fifth groups respectively adjacent to the second and third groups may be set. The number of word lines included in the fourth and fifth groups may be the same or different.

In step S1303, when the second and third groups adjacent to the first group are set, the operation proceeds to step S1207.

In step S1207, when the first to third groups are set, the memory device may set the floating time point for each group. For example, it may be determined that the word lines included in the first group including the center word line are first floated. Next, the word lines included in the two groups adjacent to the group including the center word line, that is, the word lines included in the second and third groups may be determined as the word lines to be floated next.

When the floating time point of the word lines are determined, in step S1305, the memory device may first apply the floating voltage to the word line of the first group. That is, because the first group is the group including the center word line and the potential of the word lines included in a corresponding group is required to be highest, the floating voltage may be first applied to the word lines included in the first group.

Thereafter, in step S1307, the floating voltage may be simultaneously applied to the word lines of the second and third groups. That is, the floating voltage may be simultaneously applied to the word line of the second and third groups in order to sequentially decrease the potential of the word lines from the center word line to the edge word line.

Although not shown in the present drawing, when the fourth and fifth groups adjacent to the second and third groups are set, after the floating voltage is simultaneously applied to the word lines of the second and third groups, the floating voltage may be simultaneously applied to the word lines of the fourth and fifth groups.

Figure 14:
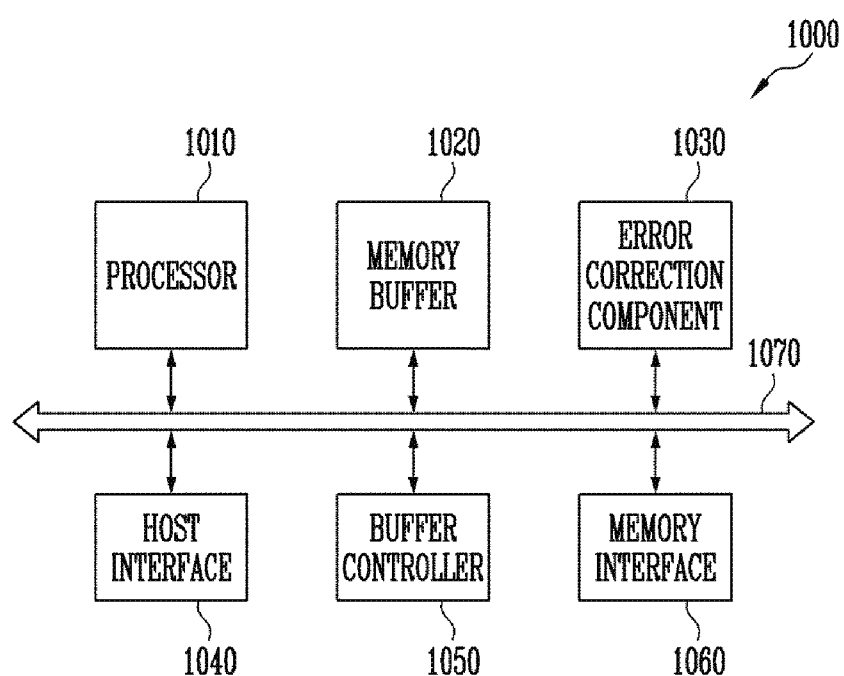
FIG. 14 is a diagram for describing another embodiment of the memory controller of FIG. 1.

FIG. 14 is a diagram for describing another embodiment of the memory controller of FIG. 1.

The memory controller 1000 is connected to a host and the memory device. The memory controller 1000 is configured to access the memory device in response to the request from the host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 14, the memory controller 1000 may include a processor 1010, a memory buffer 1020, an error correction component (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation.

The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. An address mapping method of the flash translation layer include a plurality of mapping methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction component 1030 may perform error correction. The error correction component 1030 may perform error correction encoding (ECC encoding) based on data to be written to the memory device through memory interface 1060. The error correction encoded data may be transferred to the memory device through the memory interface 1060. The error correction component 1030 may perform error correction decoding (ECC decoding) on the data received from the memory device through the memory interface 1060. For example, the error correction component 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection express (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 may not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the error correction component 1030, and the memory interface 1060. The control bus may be connected to the host interface 1040, the processor 1010, the buffer controller 1050, the memory buffer 1202, and the memory interface 1060.

Figure 15:
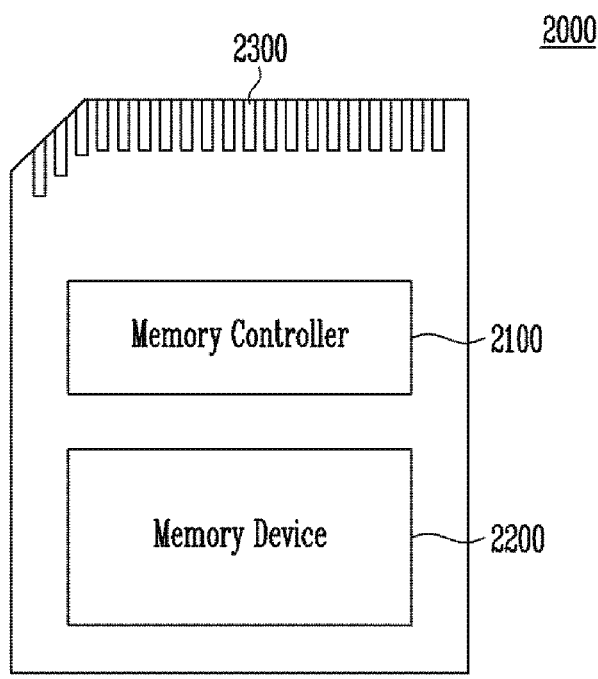
FIG. 15 is a block diagram illustrating a memory card system to which the storage device according to an embodiment of the present disclosure is applied.

FIG. 15 is a block diagram illustrating a memory card system 2000 to which the storage device according to an embodiment of the present disclosure is applied.

Referring to FIG. 15, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented equally to the memory device 100 of FIG. 1 described with reference to FIG. 2.

As an example, the memory controller 2100 may include components such as a random access memory (RAM), a processor, a host interface, a memory interface, and an error correction component.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. As an example, the connector 2300 may be defined by at least one of the various communication standards described above.

As an example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

In an embodiment, the memory device 2200 may receive the partial erase command from the memory controller 2100. The partial erase command may be a command instructing to erase a specific portion of any one of a plurality of memory blocks included in the memory device 2200, that is, a specific sub block among a plurality of sub blocks included in any one memory block.

When receiving the partial erase command, the memory device 2200 may determine the target sub block and the adjacent sub block. The target sub block may be the sub block on which the partial erase operation corresponding to the partial erase command is performed, and the adjacent sub block may be the sub block adjacent to the target sub block.

Thereafter, the memory device 2200 may divide the plurality of word lines connected to the adjacent sub block into the plurality of groups. At this time, the plurality of groups may be divided into the first group including the center word line positioned at the most center among the plurality of word lines connected to the adjacent sub block, and the second and third groups adjacent to the first group. Here, the number of word lines included in the second and third groups may be the same or different.

In another embodiment, the plurality of word lines connected to the adjacent sub block may be divided into the first group including the center word line positioned at the most center, the second and third groups adjacent to the first group, and the fourth and fifth groups respectively adjacent to the second and third groups. At this time, the number of word lines included in each of the second and third groups, and the number of word lines included in each of the fourth and fifth groups may be the same or different.

In an embodiment, when the word lines connected to the adjacent sub block are divided into the plurality of groups, the memory device 2200 may determine the floating time point of the word lines included in the plurality of groups, and may apply the floating voltage to the word lines of a corresponding group at each floating time point. At this time, the memory device 2200 may set to first float the word lines of the group including the center word line.

Thereafter, after floating the word lines of the first group including the center word line, the memory device 2200 may simultaneously float the word lines of the second and third groups adjacent to the first group. The voltage level of the word line may be sequentially lowered from the center word line to the edge word line in the adjacent sub block by simultaneously floating the word lines of the second and third groups.

When the adjacent sub block is divided into the first to fifth groups, the memory device 2200 may first float the word lines of the first group including the center word line, float the word lines of the second and third groups adjacent to the first group, and then float the word lines of the fourth and fifth groups respectively adjacent to the second and third groups. Also in this case, the voltage level of the word line may be sequentially lowered from the center word line to the edge word line in the adjacent sub block.

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 16:
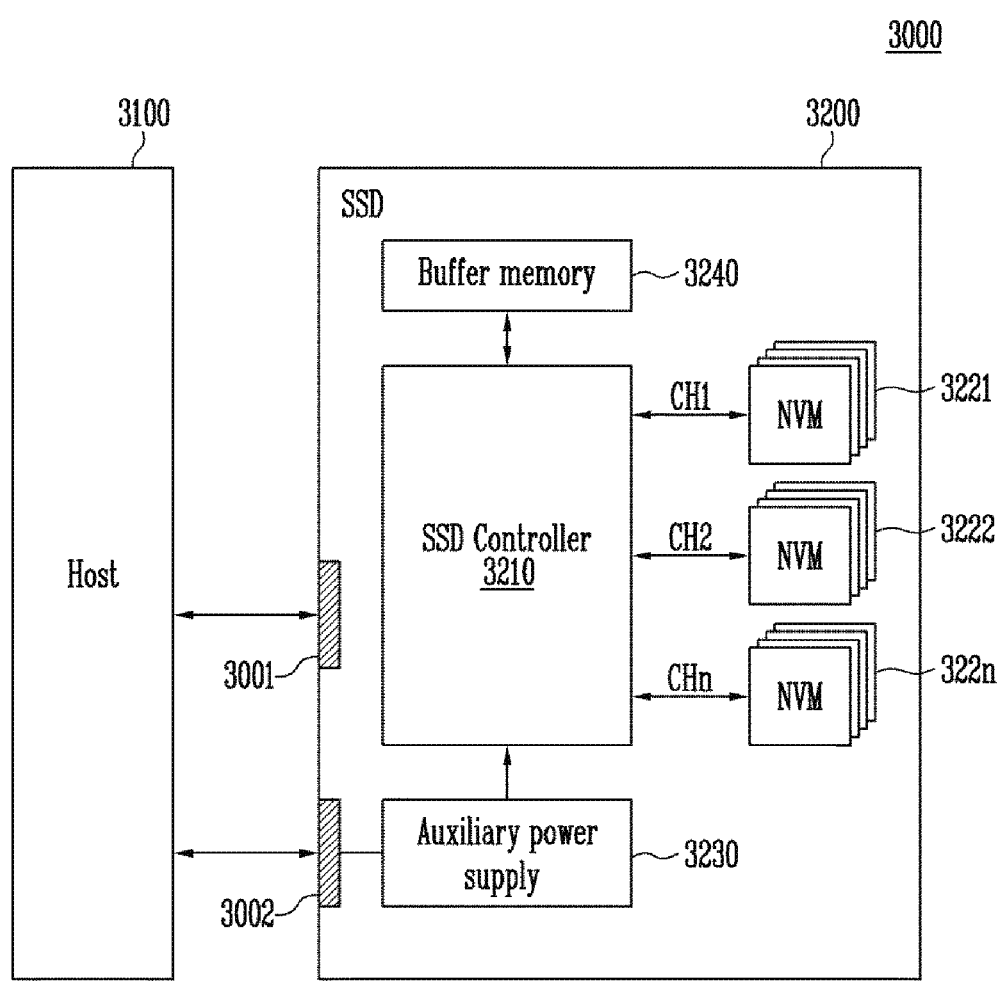
FIG. 16 is a block diagram illustrating a solid state drive (SSD) system to which the storage device according to an embodiment of the present disclosure is applied.

FIG. 16 is a block diagram illustrating a solid state drive (SSD) system 3000 to which the storage device according to an embodiment of the present disclosure is applied.

Referring to FIG. 16, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform a function of the memory controller 200 of FIG. 1 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

In an embodiment, each of the plurality of flash memories 3221 to 322n may receive the partial erase command from the SSD controller 3210. The partial erase command may be a command instructing to erase a specific portion of any one of a plurality of memory blocks included in each of the plurality of flash memories 3221 to 322n, that is, a specific sub block among a plurality of sub blocks included in any one memory block.

When receiving the partial erase command, the plurality of flash memories 3221 to 322n may determine the target sub block and the adjacent sub block. The target sub block may be the sub block on which the partial erase operation corresponding to the partial erase command is performed, and the adjacent sub block may be the sub block adjacent to the target sub block.

Thereafter, the plurality of flash memories 3221 to 322n may divide the plurality of word lines connected to the adjacent sub block into the plurality of groups. At this time, the plurality of groups may be divided into the first group including the center word line positioned at the most center among the plurality of word lines connected to the adjacent sub block, and the second and third groups adjacent to the first group. Here, the number of word lines included in the second and third groups may be the same or different.

In another embodiment, the plurality of word lines connected to the adjacent sub block may be divided into the first group including the center word line positioned at the most center, the second and third groups adjacent to the first group, and the fourth and fifth groups respectively adjacent to the second and third groups. At this time, the number of word lines included in each of the second and third groups, and the number of word lines included in each of the fourth and fifth groups may be the same or different.

In an embodiment, when the word lines connected to the adjacent sub block are divided into the plurality of groups, the plurality of flash memories 3221 to 322n may determine the floating time point of the word lines included in the plurality of groups, and may apply the floating voltage to the word lines of a corresponding group at each floating time point. At this time, the plurality of flash memories 3221 to 322n may set to first float the word lines of the group including the center word line.

Thereafter, after floating the word lines of the first group including the center word line, the plurality of flash memories 3221 to 322n may simultaneously float the word lines of the second and third groups adjacent to the first group. The voltage level of the word line may be sequentially lowered from the center word line to the edge word line in the adjacent sub block by simultaneously floating the word lines of the second and third groups.

When the adjacent sub block is divided into the first to fifth groups, the plurality of flash memories 3221 to 322n may first float the word lines of the first group including the center word line, float the word lines of the second and third groups adjacent to the first group, and then float the word lines of the fourth and fifth groups respectively adjacent to the second and third groups. Also in this case, the voltage level of the word line may be sequentially lowered from the center word line to the edge word line in the adjacent sub block.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 17:
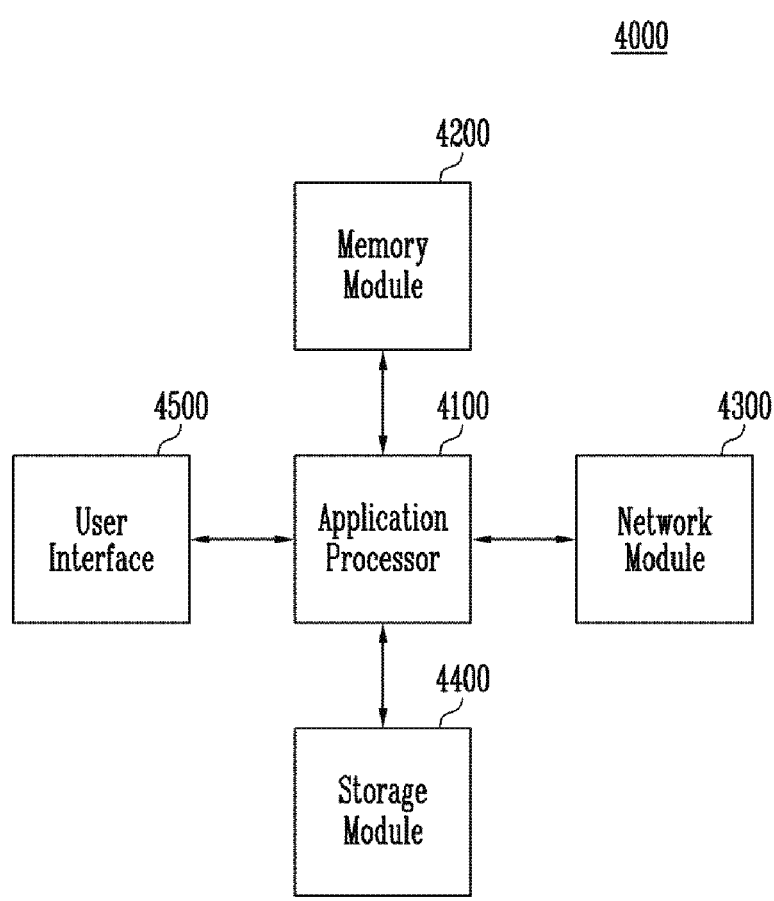
FIG. 17 is a block diagram illustrating a user system to which the storage device according to an embodiment of the present disclosure is applied.

FIG. 17 is a block diagram illustrating a user system 4000 to which the storage device according to an embodiment of the present disclosure is applied.

Referring to FIG. 17, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device described with reference to FIGS. 2 and 3. The storage module 4400 may operate identically to the storage device 50 described with reference to FIG. 1.

In an embodiment, the storage module 4400 may receive the partial erase command from the application processor 4100. The partial erase command may be a command instructing to erase a specific portion of any one of a plurality of memory blocks included in the storage module 4400, that is, a specific sub block among a plurality of sub blocks included in any one memory block.

When receiving the partial erase command, the storage module 4400 may determine the target sub block and the adjacent sub block. The target sub block may be the sub block on which the partial erase operation corresponding to the partial erase command is performed, and the adjacent sub block may be the sub block adjacent to the target sub block.

Thereafter, the storage module 4400 may divide the plurality of word lines connected to the adjacent sub block into the plurality of groups. At this time, the plurality of groups may be divided into the first group including the center word line positioned at the most center among the plurality of word lines connected to the adjacent sub block, and the second and third groups adjacent to the first group. Here, the number of word lines included in the second and third groups may be the same or different.

In another embodiment, the plurality of word lines connected to the adjacent sub block may be divided into the first group including the center word line positioned at the most center, the second and third groups adjacent to the first group, and the fourth and fifth groups respectively adjacent to the second and third groups. At this time, the number of word lines included in each of the second and third groups, and the number of word lines included in each of the fourth and fifth groups may be the same or different.

In an embodiment, when the word lines connected to the adjacent sub block are divided into the plurality of groups, the storage module 4400 may determine the floating time point of the word lines included in the plurality of groups, and may apply the floating voltage to the word lines of a corresponding group at each floating time point. At this time, the storage module 4400 may set to first float the word lines of the group including the center word line.

Thereafter, after floating the word lines of the first group including the center word line, the storage module 4400 may simultaneously float the word lines of the second and third groups adjacent to the first group. The voltage level of the word line may be sequentially lowered from the center word line to the edge word line in the adjacent sub block by simultaneously floating the word lines of the second and third groups.

When the adjacent sub block is divided into the first to fifth groups, the storage module 4400 may first float the word lines of the first group including the center word line, float the word lines of the second and third groups adjacent to the first group, and then float the word lines of the fourth and fifth groups respectively adjacent to the second and third groups. Also in this case, the voltage level of the word line may be sequentially lowered from the center word line to the edge word line in the adjacent sub block.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
   a memory block comprising sub blocks;
   a voltage generator configured to generate operating voltages to be used to perform an erase operation on a target sub block among the sub blocks, wherein the operating voltages include an erase voltage applied to the memory block and word line voltages applied to the sub blocks;
   a row decoder including a plurality of pass switches transferring the operating voltages to the sub blocks, wherein the plurality of pass switches are connected to the voltage generator through global word lines, and the pass switches are connected to the sub blocks through local word lines, and wherein the pass switches control the global word lines to be coupled to the local word lines in response to an application of a block word line voltage; and
   control logic configured to control the voltage generator and the row decoder to apply the word line voltages to the global word lines at different times during the erase operation.

2. The memory device of claim 1, wherein the control logic is configured to divide the local word lines connected to an adjacent sub block neighboring the target sub block into a plurality of groups, and control the voltage generator and the row decoder to apply the word line voltages at different times to the global word lines corresponding to each group during the erase operation.

3. The memory device of claim 2, wherein the control logic is configured to set a group including a local word line positioned at the most center of the local word lines connected to the adjacent sub block as a first group and set groups including local word lines adjacent to the first group to a second group and a third group of the plurality of groups, respectively.

4. The memory device of claim 3, wherein the control logic is configured to control the voltage generator and the row decoder to apply the word line voltages to the global word lines corresponding to the first group firstly, before applying the word line voltages to the global word lines corresponding to the second and third groups.

5. The memory device of claim 4, wherein the voltage generator is configured to first generate first word line voltages to be applied to the global word lines corresponding to the first group and wherein the row decoder is configured to apply the first word line voltages to the global word lines corresponding to the first group, during the erase operation.

6. The memory device of claim 4, wherein the control logic is configured to control the voltage generator and the row decoder to simultaneously apply the word line voltages to the global word lines corresponding to the second group and the third group after the word line voltages are applied to the global word lines corresponding to in the first group firstly.

7. The memory device of claim 6, wherein the voltage generator is configured to generate, when the word line voltages are applied to the global word lines corresponding to the first group, second word line voltages to be applied to the global word lines corresponding to the second group and the third group and then wherein the row decoder is configured to apply the second word line voltages to the global word lines corresponding to the second group and the third group.

8. The memory device of claim 7, wherein a voltage of the local word lines included in the first group increases to a first target voltage and a voltage of the local word lines included in the second group and the third group increases to a second target voltage according to an increase of the erase voltage, and
   wherein the first target voltage is greater than the second target voltage.

9. The memory device of claim 8, wherein the second target voltage is greater than the erase voltage.

10. The memory device of claim 6, wherein the control logic is configured to control the voltage generator and the row decoder to apply the word line voltages to the global word lines corresponding to dummy word lines connected between the target sub block and the adjacent sub block, after word line voltages are simultaneously applied to the global word lines corresponding to the second group and the third group.

11. The memory device of claim 3, wherein the control logic is configured to, when residual local word lines which are adjacent to the second group and the third group but are not included in the first group are present among the local word lines connected to the adjacent sub block, set local word lines adjacent to the second group among the residual local word lines to a fourth group and set local word lines adjacent to the third group among the residual local word lines to a fifth group.

12. The memory device of claim 11, wherein the control logic is configured to control the voltage generator and the row decoder to simultaneously apply the word line voltages to global word lines corresponding to the second group and the third group after the word line voltages are applied to the global word lines corresponding to the first group firstly.

13. The memory device of claim 12, wherein the control logic is configured to control the voltage generator and the row decoder to simultaneously apply the word line voltages to the global word lines corresponding to the fourth group and the fifth group after the word line voltages are applied to the global word lines corresponding to the second group and the third group.

14. The memory device of claim 13,
wherein a voltage of the local word lines included in the first group increases to a first target voltage, a voltage of the local word lines included in the second group and the third group increases to a second target voltage and a voltage of the local word lines included in the fourth group and the fifth group increases to a third target voltage according to an increase of the erase voltage, and
wherein the first target is greater than the second target voltage and the second target voltage is greater than the third target voltage.

15. A method of operating a memory device for performing an erase operation on a target sub block included in a memory block comprising sub blocks, the method comprising:
generating operating voltages to be used to perform the erase operation on the target sub block wherein the operating voltages include an erase voltage applied to the memory block and word line voltages applied to the sub blocks
applying a block word line voltage to gates of a plurality of pass switches connected between local word lines connected to the sub blocks and global word lines corresponding to the local word lines, respectively; and
applying the word line voltages to the global word lines at different times during the erase operation.

16. The method of claim 15, further comprising:
dividing the local word lines connected to an adjacent sub block neighboring the target sub block into a plurality of groups,
wherein applying the word line voltages comprises applying the word line voltages at different times to the global word lines corresponding to each group during the erase operation.

17. The method of claim 16, wherein dividing the local word lines into the plurality of groups comprises setting a group including a local word line positioned at the most center of the local word lines connected to the adjacent sub block as a first group of the plurality of groups and setting groups including local word lines adjacent to the first group to a second group and a third group of the plurality of groups, respectively.

18. The method of claim 17, wherein applying the word line voltages comprises applying the word line voltages to the global word lines corresponding to the first group firstly.

19. The method of claim 18, wherein applying the word line voltages comprises applying the word line voltages simultaneously to the global word lines corresponding to the second group and the third group after the word line voltages are applied to the global word lines corresponding to the first group firstly.

20. The method of claim 19,
wherein a voltage of the local word lines included in the first group increases to a first target voltage and a voltage of the local word lines included in the second group and the third group increases to a second target voltage according to an increase of the erase voltage applied to the memory block,
wherein the first target voltage is greater than the second target voltage.

* * * * *